United States Patent
Lakdawala et al.

(10) Patent No.: US 9,431,961 B2
(45) Date of Patent: Aug. 30, 2016

(54) PHASE SHIFTING MIXER

(71) Applicant: QUALCOMM Incorporated, San Diego, CA (US)

(72) Inventors: Hasnain Mohammedi Lakdawala, San Diego, CA (US); Bin Fan, San Diego, CA (US); Ojas Mahendra Choksi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/576,013

(22) Filed: Dec. 18, 2014

(65) Prior Publication Data

US 2016/0126894 A1     May 5, 2016

Related U.S. Application Data

(60) Provisional application No. 62/072,354, filed on Oct. 29, 2014.

(51) Int. Cl.

| | |
|---|---|
| *H04B 1/10* | (2006.01) |
| *H03D 7/14* | (2006.01) |
| *H04B 1/40* | (2015.01) |
| *H03D 3/00* | (2006.01) |
| *H04L 27/20* | (2006.01) |
| *H04B 1/26* | (2006.01) |

(52) U.S. Cl.
CPC ............. *H03D 7/1441* (2013.01); *H03D 3/009* (2013.01); *H04B 1/40* (2013.01); *H04L 27/206* (2013.01); *H04L 27/2089* (2013.01)

(58) Field of Classification Search
CPC .. H04B 1/12; H04B 1/123; H04B 2001/305; H04B 2001/307; H03D 7/18; H03D 7/165; H03D 7/166
USPC .................................... 455/302–305
See application file for complete search history.

(56) References Cited

U.S. PATENT DOCUMENTS

| | | | |
|---|---|---|---|
| 6,891,423 B2 | 5/2005 | Bjork et al. | |
| 7,519,348 B2 | 4/2009 | Shah | |
| 7,545,855 B2 | 6/2009 | Afsahi et al. | |
| 8,594,603 B2 | 11/2013 | Balankutty et al. | |
| 2010/0041359 A1 | 2/2010 | Liu et al. | |
| 2011/0059709 A1 | 3/2011 | Collins, III | |

(Continued)

FOREIGN PATENT DOCUMENTS

| | | |
|---|---|---|
| EP | 0877476 A1 | 11/1998 |
| WO | 2011019850 A1 | 2/2011 |

OTHER PUBLICATIONS

Partial International Search Report—PCT/US2015/052717—ISA/EPO—Dec. 9, 2015.

(Continued)

*Primary Examiner* — Lee Nguyen

(74) *Attorney, Agent, or Firm* — Procopio, Cory, Hargreaves & Savitch, LLP

(57) ABSTRACT

Performing quadrature combining and adjusting including: a plurality of mixing circuits configured to generate a plurality of frequency converted signals; at least one mixing circuit of the plurality of mixing circuits is configured with a plurality of paths, each path representing one linearity mode; and a plurality of combining circuits configured to combine the plurality of frequency converted signals to generate a differential baseband output signal.

18 Claims, 20 Drawing Sheets

(56) References Cited

U.S. PATENT DOCUMENTS

2011/0105072 A1    5/2011  Bhagat et al.
2011/0222633 A1*  9/2011  Pullela .................. H03D 7/165
                                                                           375/318

2014/0270021 A1    9/2014  McKay et al.

OTHER PUBLICATIONS

International Search Report and Written Opinion—PCT/US2015/052717—ISA/EPO—Mar. 9, 2016.

* cited by examiner $$PCIO = \cos(\omega\, t)\left(1 - \frac{\alpha^2}{4}\right)\cos\left(\frac{\Delta}{2}\right)$$

$$PCQO = \sin(\omega\, t)\left(1 - \frac{\alpha^2}{4}\right)\cos\left(\frac{\Delta}{2}\right)$$

US 9,431,961 B2

PHASE SHIFTING MIXER

CROSS-REFERENCE TO RELATED APPLICATIONS

This application claims the benefit of priority under 35 U.S.C. §119(e) of U.S. Provisional Patent Application No. 62/072,354, filed Oct. 29, 2014, entitled "Phase Shifting Mixer." The disclosure of the above-referenced application is incorporated herein by reference.

BACKGROUND

1. Field

This invention relates generally to mixers, and more specifically, to phase adjusting circuits in the mixers.

2. Background

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1xRTT (1 times Radio Transmission Technology, or simply 1x), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

Certain embodiments of the present disclosure generally relate to quadrature combining and adjusting in radio frequency (RF) circuits including phase shifting mixers. In one embodiment, the present disclosure provides for adjusting phase imbalance at the baseband (BB) I and Q components in auxiliary mixer devices. In a particular embodiment, each auxiliary mixer device is configured as a combination of devices having a plurality of paths of multiple linearity modes. The detailed description set forth below is intended as a description of exemplary designs of the present disclosure and is not intended to represent the only designs in which the present disclosure can be practiced.

The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and the like. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11 (Wireless Local Area Network (WLAN)), IEEE 802.16 (Worldwide Interoperability for Microwave Access (WiMAX)), Long Term Evolution (LTE) (e.g., in TDD and/or FDD modes), or some other standards. A TDMA system may implement Global System for Mobile Communications (GSM) or some other standards. These various standards are known in the art. The techniques described herein may also be implemented in any of various other suitable wireless systems using radio frequency (RF) technology, including Global Navigation Satellite System (GNSS), Bluetooth, IEEE 802.15 (Wireless Personal Area Network (WPAN)), Near Field Communication (NFC), Small Cell, Frequency Modulation (FM), and the like.

An Example Wireless System

Figure 1:
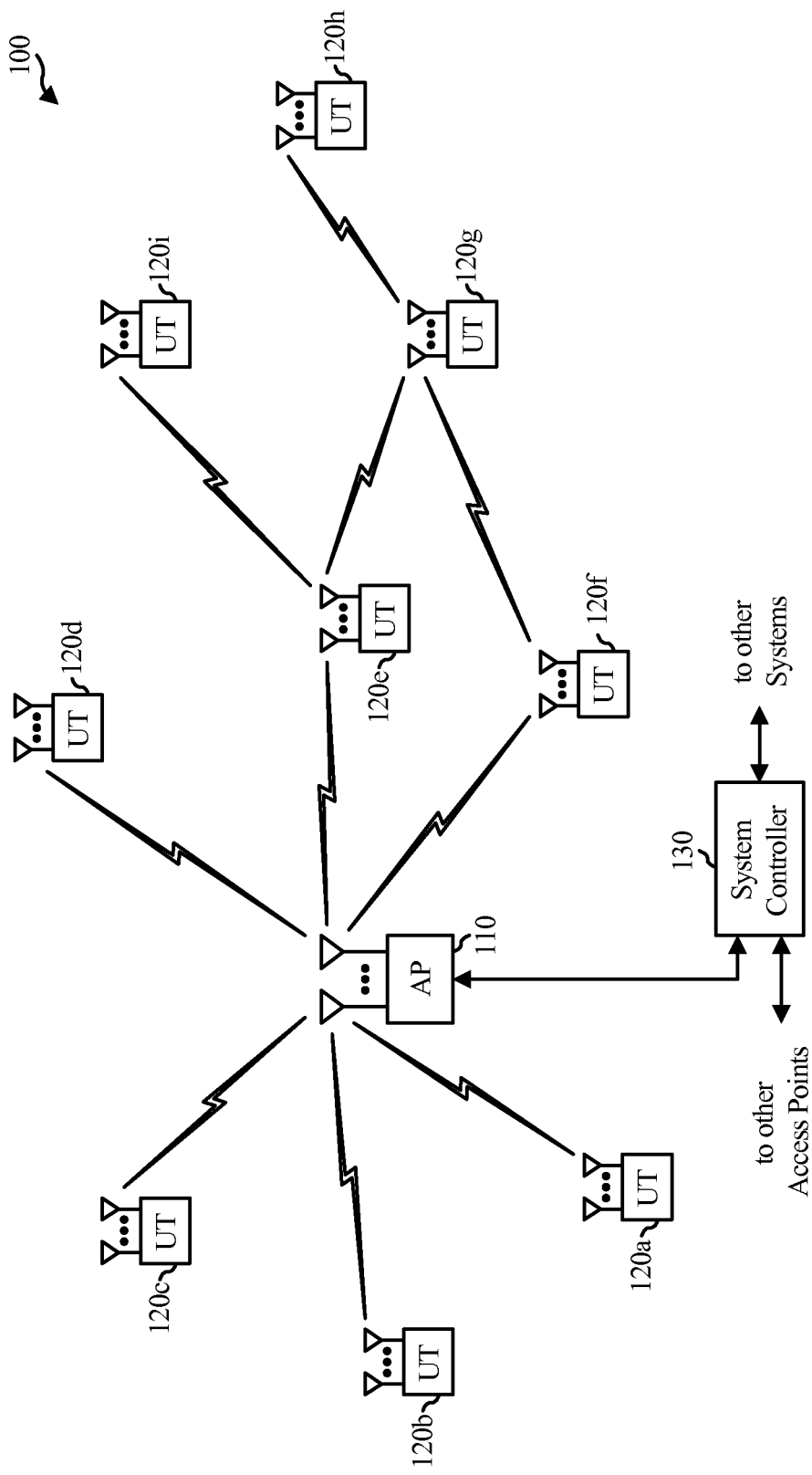
FIG. 1 illustrates a wireless communications system with access points and user terminals.

FIG. 1 illustrates a wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink may share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
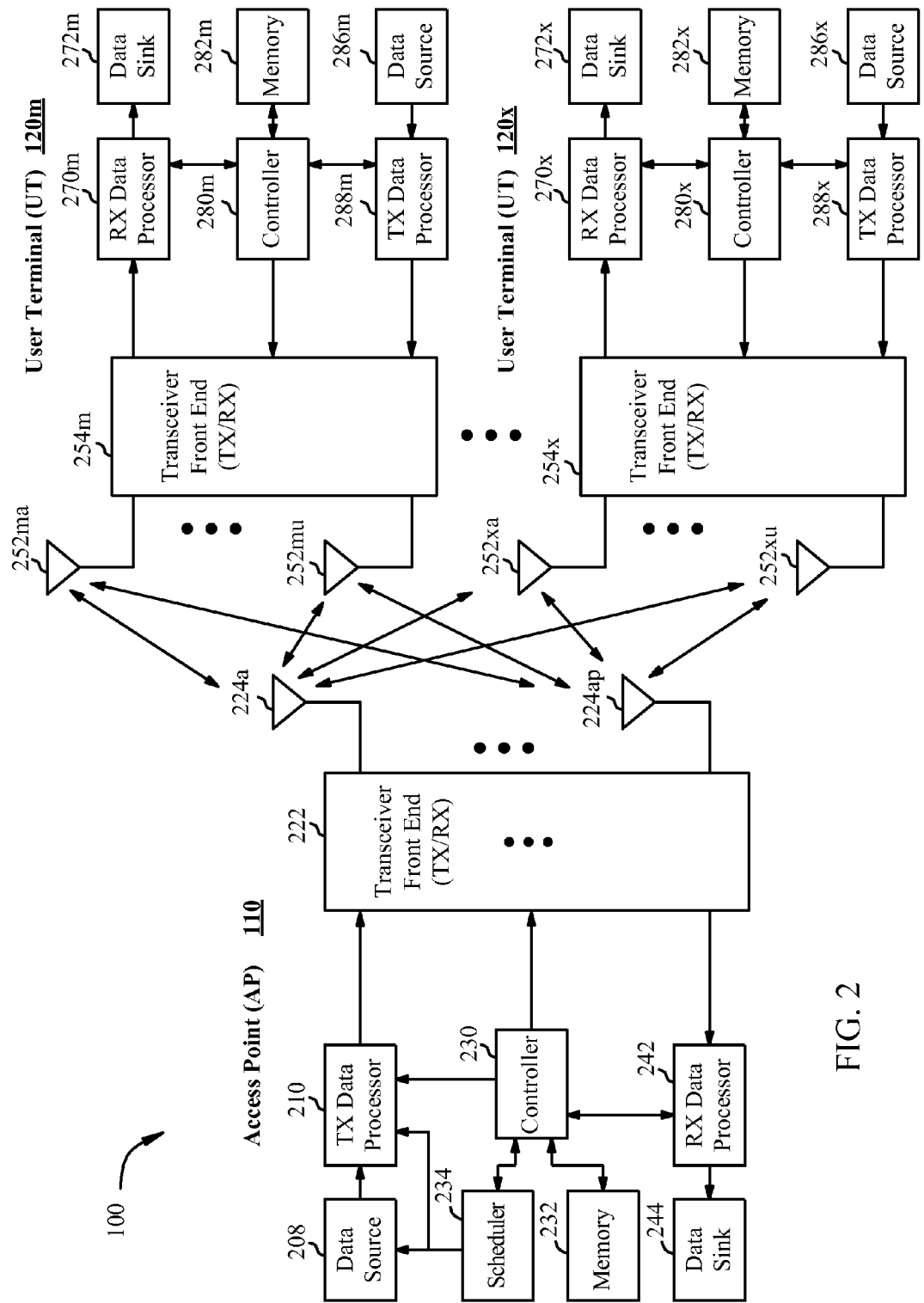
FIG. 2 shows a block diagram of an access point and two user terminals in a wireless system.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain embodiments of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222.

At each user terminal 120, $N_{ut,m}$ antennas 252 receive the downlink signals from access point 110. For receive diversity at the user terminal 120, the transceiver front end 254 may select signals received from one of the antennas 252 for processing. For certain embodiments of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, and combinations thereof.

Figure 3:
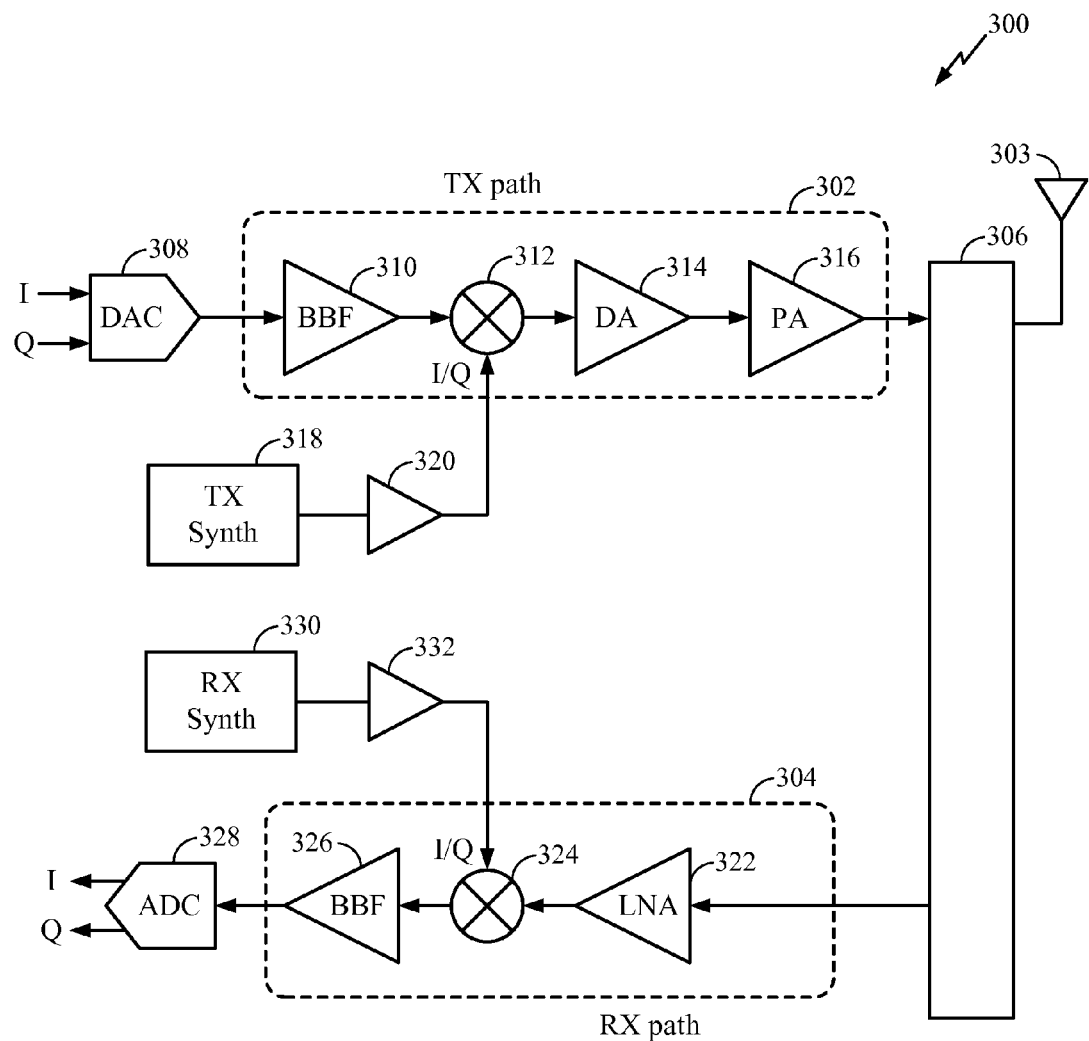
FIG. 3 is a block diagram of an exemplary transceiver front end, such as transceiver front ends in FIG. 2, in accordance with certain embodiments of the present disclosure.

FIG. 3 is a block diagram of an exemplary transceiver front end 300, such as transceiver front ends 222, 254 in FIG. 2, in accordance with certain embodiments of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, surface acoustic wave (SAW) filters, and the like. Exemplary transceiver front ends may be found in U.S. patent application Ser. No. 14/465,442, filed Aug. 21, 2014 and entitled "Quadrature Combining and Adjusting," which is incorporated herein by reference in its entirety. Further, in half-duplex systems, several techniques can be employed to eliminate the receiver SAW filter ("SAW-less") due to the absence of concurrent operation of the transmitter. However, the removal of the input SAW filter causes jammers with high input levels to be present at the low noise amplifier (LNA) input. Further, the removal of the input SAW filter increases the dynamic range requirement up to 110 dB.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324. The transmit LO (and/or the receive LO) may be generated, for example, by frequency dividing the VCO signal by an integer value or by using an LO generating circuit which translates the VCO frequency to the LO frequency. Exemplary LO generating circuits may be found in U.S. Pat. No. 6,960,962 to Peterzell et al., filed Dec. 10, 2001 and entitled "Local Oscillator Leakage Control in Direct Conversion Processes," which is incorporated herein by reference in its entirety. Although not shown in FIG. 3, a person having ordinary skill in the art will understand that the transmit LO (or receive LO) frequency dividing or generating circuit occurs inside the TX frequency synthesizer 318 (or RX frequency synthesizer 330).

Example Quadrature Combining and Adjusting

Figure 4A:
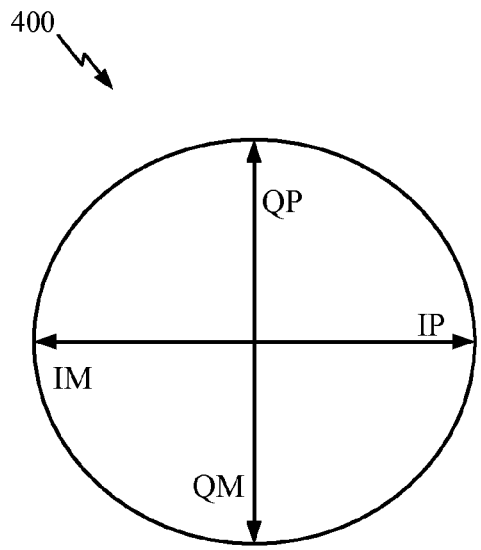
FIG. 4A is a vector diagram of idealized I and Q components with no phase mismatch between the I and Q components, such that the Q component is exactly 90° out of phase with the I component.

Wireless communication systems transmitting radio frequency (RF) signals typically utilize in-phase (I) and quadrature (Q) components, where the Q component is approximately 90° out of phase with the I component. Ideally, there would be no phase mismatch between the I and Q components, such that the Q component is exactly 90° out of phase with the I component. This ideal situation is illustrated in the vector diagram 400 of FIG. 4A, where "P" and "M" represent the positive and negative differential signals. Thus, vector QP represents the gain and phase of the +Q signal of a differential Q signal, while vector QM represents the gain and phase of the −Q signal. Likewise, vector IP represents the gain and phase of the +I signal of a differential I signal, while vector IM represents the gain and phase of the −I signal.

Figure 4B:
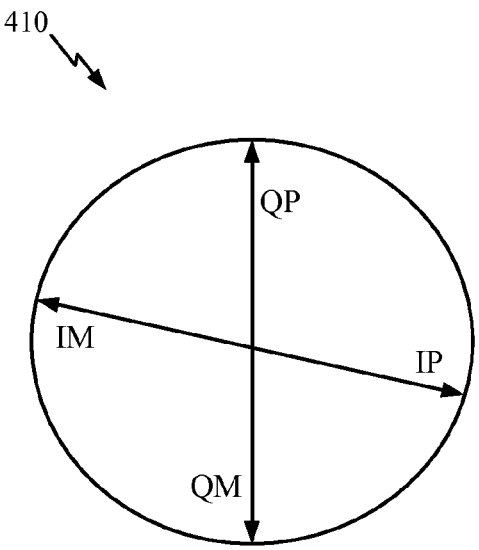
FIG. 4B is a vector diagram of I and Q components with some phase imbalance (more or less than the ideal 90°) between the I and Q components.

Typically, however, there is some phase imbalance (more or less than the ideal) 90° between the I and Q components as illustrated in the vector diagram 410 of FIG. 4B, such that there is increased residual sideband (RSB) (i.e., the image rejection suffers). Such phase imbalance is very common in real-world RF circuits and occurs when the circuit components (e.g., transistors, resistors, and capacitors) are not perfectly matched between I and Q paths.

Figure 4C:
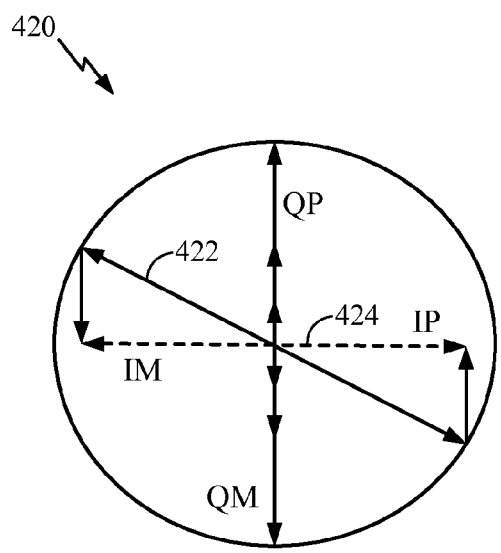
FIG. 4C is a vector diagram of I and Q components showing either the I or Q local oscillator (LO) and/or baseband (BB) that are phase shifted (e.g., by introducing an intentional delay into the I or Q baseband signal generated by the mixers) in a simplex phase imbalance correction.

In an attempt to remove the RSB phase error, either the I or Q local oscillator (LO) and/or baseband (BB) may be phase shifted (e.g., by introducing an intentional delay into the I or Q baseband signal generated by the mixers) in a simplex phase imbalance correction, as illustrated in the vector diagram 420 of FIG. 4C where the IP/IM signals, for example, are adjusted from the solid line 422 to the dotted line 424. However, this simplex correction may introduce an amplitude error, as illustrated by the dotted line 424, where the adjusted IP/IM signals have a smaller amplitude than the QP/QM signals.

Accordingly, what is needed are techniques and apparatus for improved RSB phase error calibration that does not introduce an amplitude error.

Phase Adjustment Using Auxiliary Mixers

Certain embodiments of the present disclosure perform phase imbalance adjustment at outputs of the I and Q mixers in the RFFE of a wireless communication device in an effort to correct the phase imbalance at the baseband (BB) I and Q components. For certain embodiments, this adjustment may be performed using auxiliary mixers in conjunction with the conventional I and Q mixers.

Figure 4D:
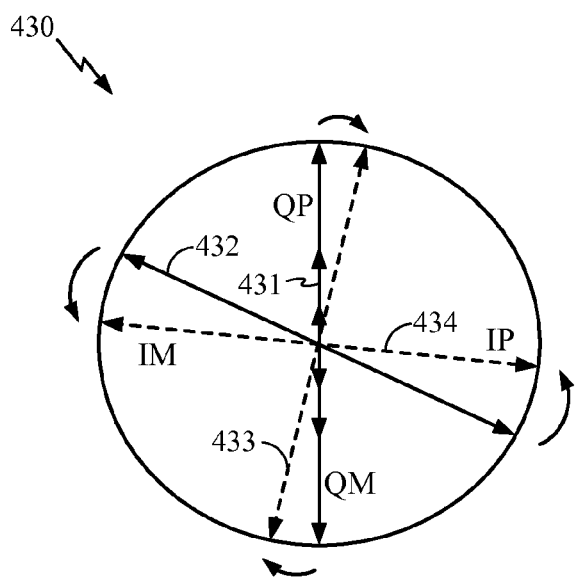
FIG. 4D is a vector diagram combining I and Q components using any suitable portion of the outputs of the auxiliary mixers which are not limited to a fraction of $\frac{1}{16}$ to accomplish duplex phase imbalance adjustment.
Figure 5:
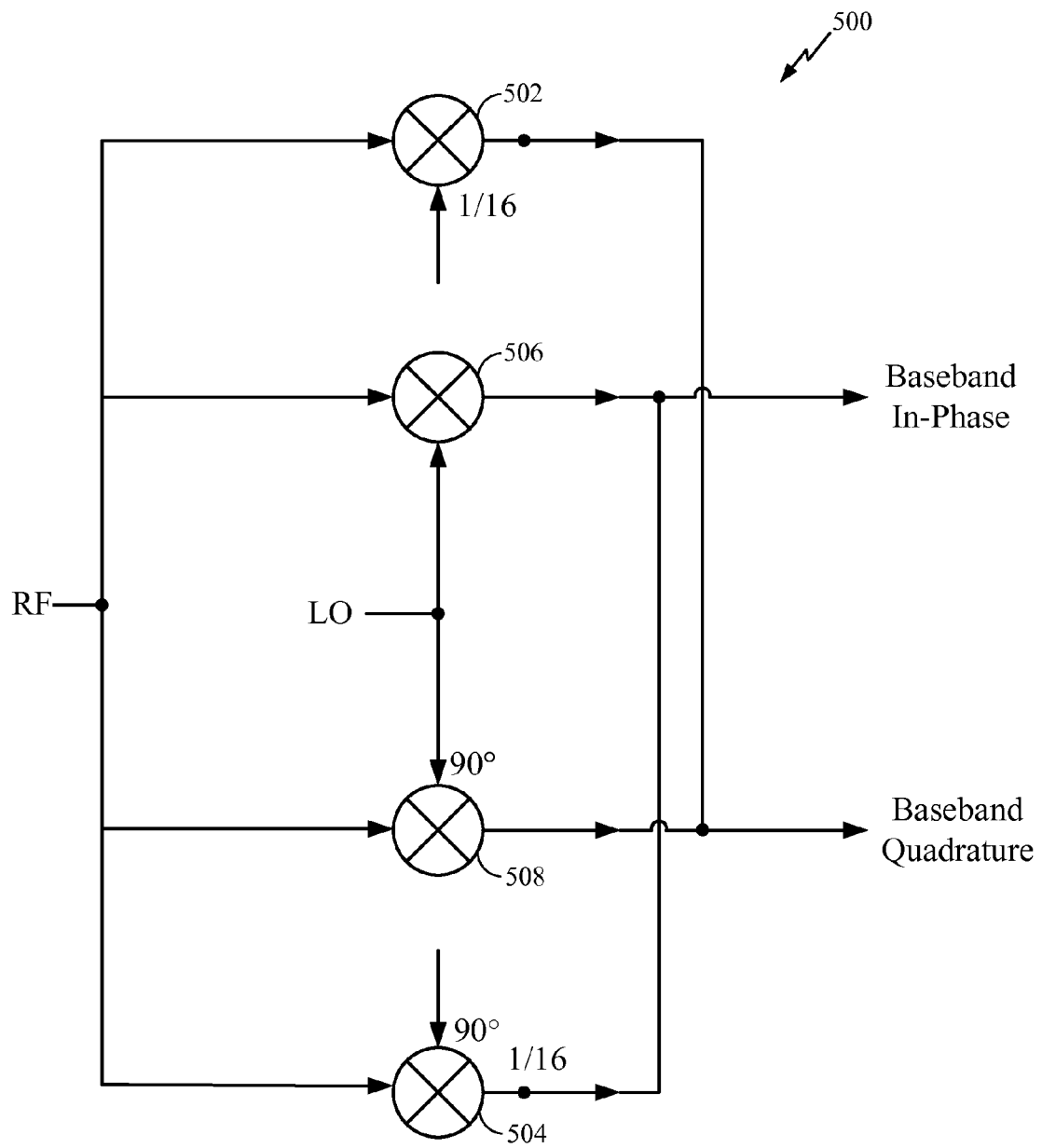
FIG. 5 is a block diagram of an exemplary phase imbalance adjusting circuit using auxiliary mixers according to an embodiment of the present disclosure.

FIG. 5 is a block diagram of an exemplary phase imbalance adjusting circuit 500 using auxiliary mixers 502, 504, according to an embodiment of the present disclosure. From top to bottom, FIG. 5 illustrates an I auxiliary mixer 502, an I mixer 506, a Q mixer 508, and a Q auxiliary mixer 504. The two auxiliary mixers 502, 504 are used to combine (e.g., current combine) a partial Q output (e.g., a fraction of the gain of the signal output by the Q auxiliary mixer) with the I output and combine a partial I output with the Q output. In this example, 1/16 the output of the I auxiliary mixer 502 is combined (e.g., via current summing) with the output of the Q mixer 508, and 1/16 the output of the Q auxiliary mixer 504 is combined with the output of the I mixer 506. Certain embodiments of the present disclosure may use any suitable portion of the outputs of the auxiliary mixers 502, 504 and are not limited to a fraction of 1/16. By combining I and Q mixer outputs in this manner, duplex phase imbalance adjustment may be accomplished, as shown in the vector diagram 430 of FIG. 4D. With duplex phase imbalance adjustment, the phases of both the IP/IM and QP/QM differential signal pairs are adjusted from the solid lines 431, 432 to the dotted lines 433, 434, respectively.

Figure 6A:
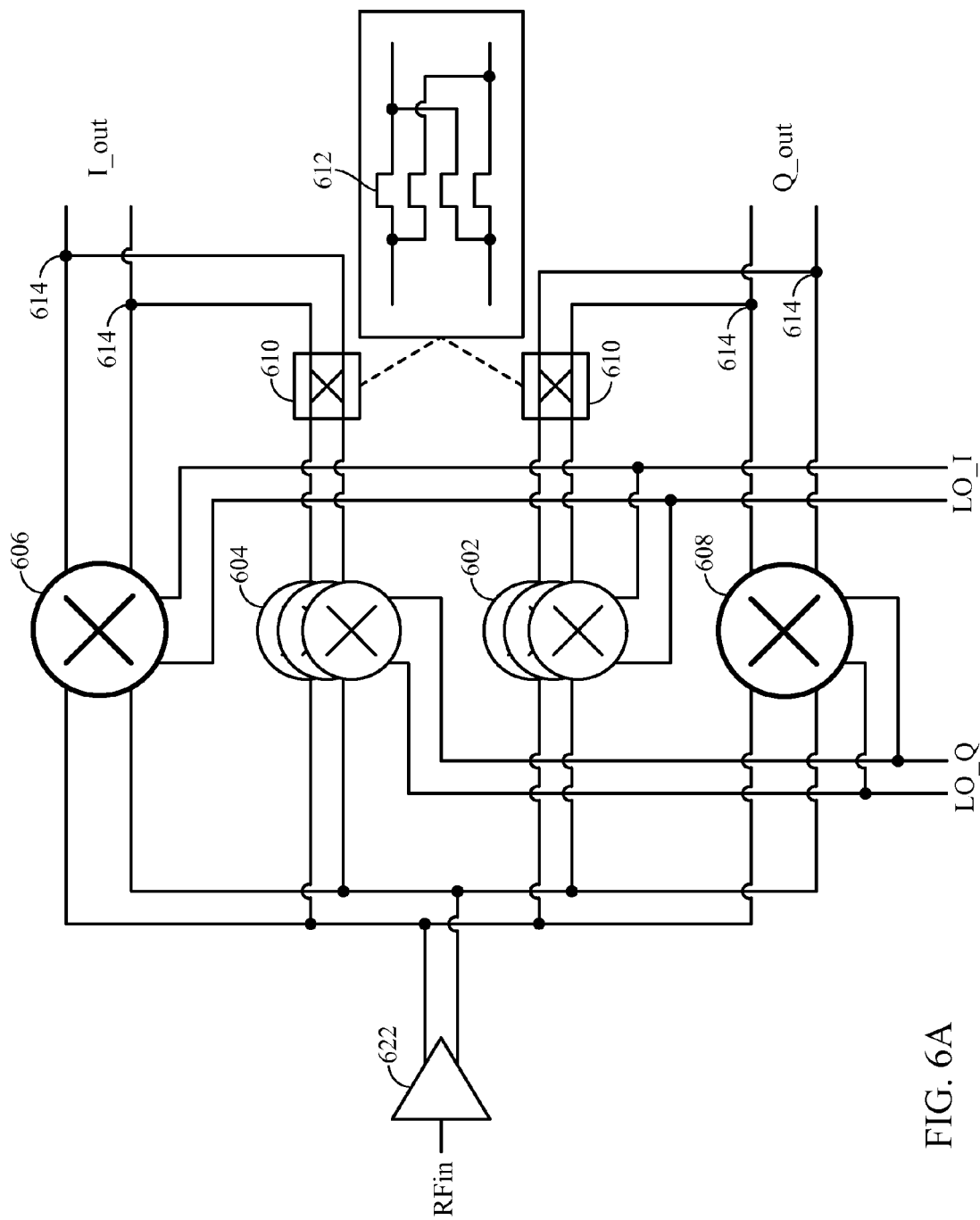
FIG. 6A is a schematic diagram of an exemplary implementation of the phase imbalance adjusting circuit of FIG. 5 using differential signals according to an embodiment of the present disclosure.

FIG. 6A is a schematic diagram of an exemplary implementation of the phase imbalance adjusting circuit 500 of FIG. 5 using differential signals, according to an embodiment of the present disclosure. The normal I and Q mixers 606, 608 are illustrated by the bolded mixing stages, while the auxiliary I and Q mixers 602, 604 are represented by the thin, stacked mixing stages. The normal I and Q mixers 606, 608 and the auxiliary I and Q mixers 602, 604 may be single-balanced or double-balanced mixers. The normal I and Q mixers 606, 608 and the auxiliary I and Q mixers 602, 604 may be implemented with any mixer structure that allows for scaling the mixer output signals, such as the mixers described herein and the mixers described in U.S. Pat. No. 8,072,255 to Cicalini, filed Jan. 7, 2008 and entitled "Quadrature Radio Frequency Mixer with Low Noise and Low Conversion Loss," which is incorporated herein by reference in its entirety. Furthermore, the normal I and Q mixers 606, 608 and the auxiliary I and Q mixers 602, 604 may receive LO signals with any suitable duty cycle, such as a duty cycle that provides acceptable noise and conversion gain. For example, the mixers may be implemented with nominally 25%, nominally slightly larger than 25%, or nominally 50% duty cycle I and Q LO signals.

The "X" boxes represent polarity and/or gain control circuits 610, such that the differential outputs of the auxiliary I and Q mixers 602, 604 may be amplitude adjusted and/or phase inverted (by effectively swapping the two differential signal lines). The exploded view of the polarity and/or gain control circuits 610 illustrates exemplary devices (e.g., switches, which may be combined with variable resistances or which may be combined or implemented with transistors 612 operated in the triode region) and connections for implementing the polarity and/or gain control. More detailed examples of the polarity and/or gain control circuits 610 are described below.

An input RF signal (RFin) may be amplified, buffered, or attenuated by a low noise amplifier (LNA) 622. The LNA 622 may be a transconductance amplifier configured to receive an input voltage and generate an output current. The LNA 622 may output a single-ended signal or differential signals. If the output of the LNA 622 is a differential signal as depicted in FIG. 6A, the normal I and Q mixers 606, 608 and the auxiliary I and Q mixers 602, 604 may most likely be double-balanced mixers. If the output of the LNA 622 is a single-ended signal, however, the normal and auxiliary I and Q mixers may most likely be single-balanced mixers.

The output signal from the LNA 622 may be mixed by the normal I mixer 606 with an in-phase LO (LO_I) to produce an output in-phase signal (I_out) having frequency components at the sum and difference of the two signals input to the normal I mixer 606. Similarly, the output signal from the LNA 622 may also be mixed by the normal Q mixer 608 with a quadrature LO (LO_Q, which is 90° out of phase with LO_I) to produce an output quadrature signal (Q_out) having frequency components at the sum and difference of the two signals input to the normal Q mixer 608. Furthermore, the auxiliary I mixer 602 may mix the output signal from the LNA 622 with the LO_I, and the output mixed signal is combined with the output of the normal Q mixer 608 to form Q_out. For certain embodiments, a polarity and/or gain control circuit 610 may be used to invert and/or attenuate the output signal from the auxiliary I mixer 602 before combining with the output of the normal Q mixer 608. Likewise, the auxiliary Q mixer 604 may mix the output signal from the LNA 622 with the LO_Q, and this output mixed signal is combined with the output of the normal I mixer 606 to form I_out. For certain embodiments, a polarity and/or gain control circuit 610 may be used to invert and/or attenuate the output signal from the auxiliary Q mixer 604 before combining with the output of the normal I mixer 606. In this manner, the auxiliary mixers 602, 604 may be used to accomplish duplex phase imbalance adjustment as illustrated in FIG. 4D. For certain embodiments, the combining of signals from the normal and auxiliary mixers may occur at summing nodes 614 for current summing the respective signals.

Figure 6B:
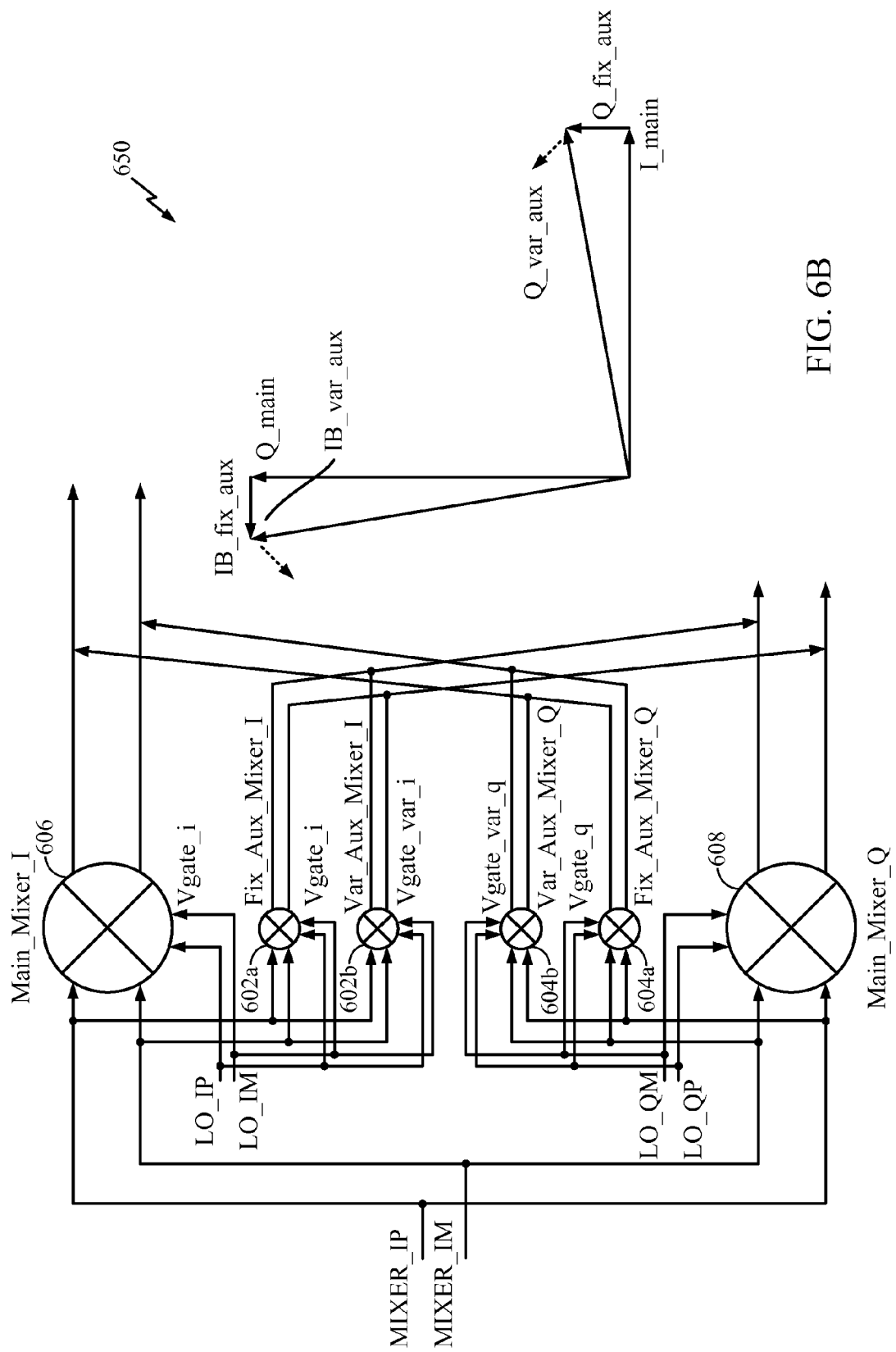
FIG. 6B is a schematic diagram of an exemplary implementation of the phase imbalance adjusting circuit of FIG. 5 using differential signals and the auxiliary mixers shown in FIG. 6A comprise fixed and variable auxiliary mixers.

For certain embodiments, the auxiliary mixers 602, 604 shown in FIG. 6A may comprise fixed and variable auxiliary mixers, as illustrated in FIG. 6B. The fixed auxiliary I and Q mixers 602a, 604a may add a constant phase shift to the Q and I baseband signals (e.g., Q_out and I_out), respectively, generated by the normal Q and I mixers 608, 606. In contrast, the variable auxiliary I and Q mixers 602b, 604b are adjustable, such that the RSB may be corrected (or at least reduced) by varying the gate voltages of transistors in the variable mixers. The fixed auxiliary mixers 602a, 604a have the effect of rotating the phase of the entire I_main and Q_main axis by the same amount. This is illustrated in the simplified two-vector diagram 650 in FIG. 6B. The phase shift of IB_fix_aux is equal to the shift of Q_fix_aux and rotates the entire constellation (here, the Q_main vector and the I_main vector) counterclockwise. It should be understood that the magnitude and angular direction of the phase shift of IB_fix_aux and Q_fix_aux are not limited by FIG. 6B. In contrast with the fixed components (IB_fix_aux and Q_fix_aux), the variable components (IB_var_aux and Q_var_aux) may be independently controlled and may rotate the I_main and Q_main vectors different amounts to correct (or at least reduce) phase imbalances. The simplified phase example in FIG. 6B depicts IB_var_aux and Q_var_aux adding to IB_fix_aux and Q_fix_aux, consistent with the mixer output connections in the corresponding circuit of FIG. 6B. However, IB_var_aux and Q_var_aux may be adjusted in either angular direction with the addition of polarity controls to the variable auxiliary I and Q mixers 602b, 604b. It should be understood that the magnitude of adjustment from IB_var_aux and Q_var_aux is not limited by FIG. 6B and may be set to correct the offsets in the I_main and Q_main signal paths absent the adjustment circuits. FIG. 4D is a more complete example vector representation of the correction possible with the circuit of FIG. 6B.

Figure 7:
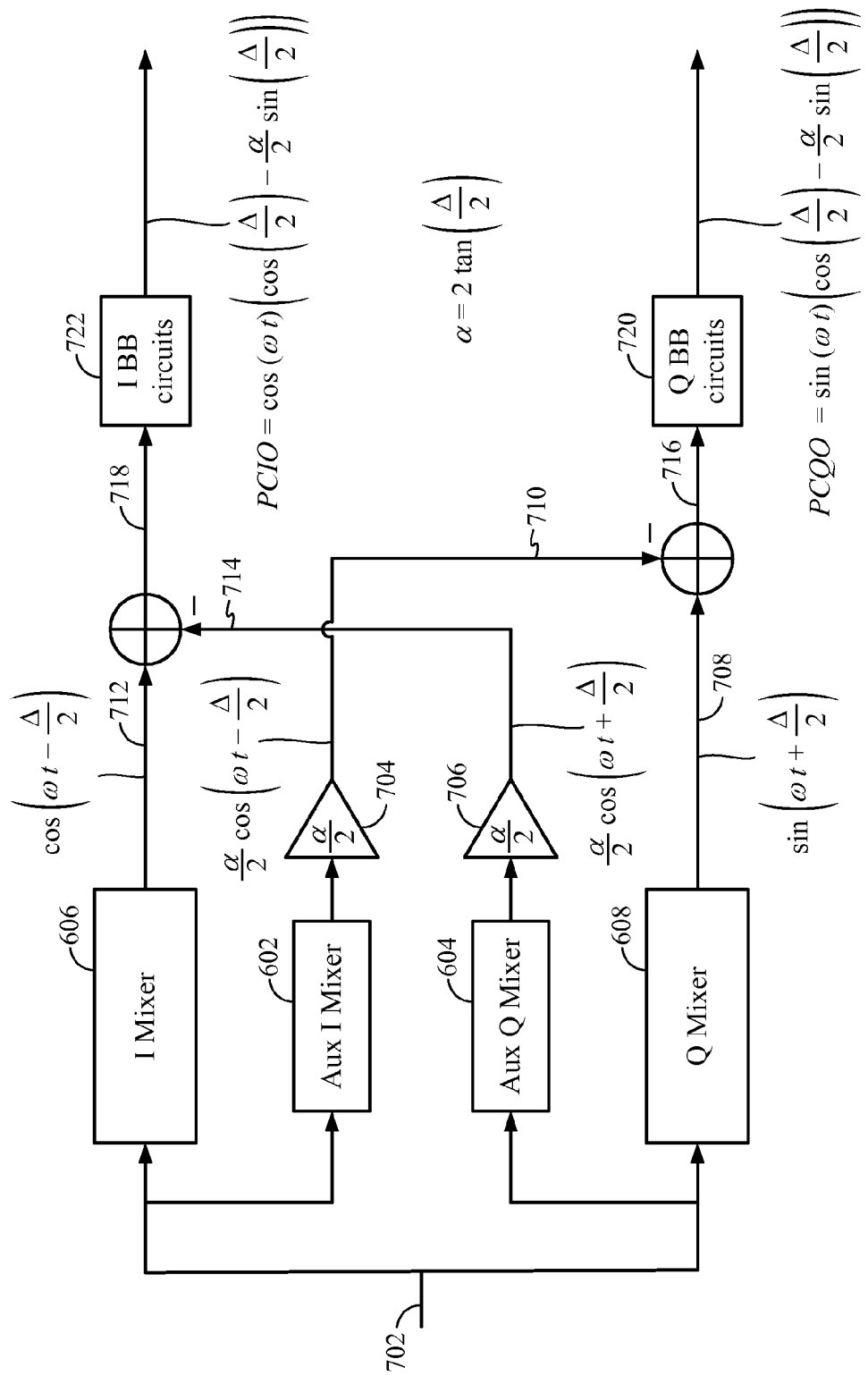
FIG. 7 is a block diagram of a phase imbalance adjusting system using auxiliary mixers and presenting associated signal equations, according to an embodiment of the present disclosure.

FIG. 7 is a block diagram conceptually illustrating the phase imbalance adjusting using auxiliary mixers and presenting associated signal equations, according to an embodiment of the present disclosure. An RF signal 702 may be provided as input to an I mixer 606 and to a Q mixer 608. In the auxiliary branches, the amplitude ($\alpha/2$) of the signal may be a fraction that of the normal mixers' outputs. In other words, the auxiliary mixers 602, 604 (or more specifically, the gain control circuits 704, 706 implemented in or connected with the auxiliary mixers) may output a partial signal to combine with the output from another mixer. For example, as illustrated, an output 708 from the Q mixer 608 may be combined (e.g., summed) with the partial output 710 from the auxiliary I mixer 602, and an output 712 from the I mixer 606 may be combined with the partial output 714 from the auxiliary Q mixer 604. These signal combinations 716, 718 may be processed in the Q and I baseband (BB) circuits 720, 722 (e.g., BB filters), respectively, thereby leading to the phase-corrected in-phase output (PCIO) and phase-corrected quadrature output (PCQO) signals with associated equations as shown in FIG. 7.

Figure 8:
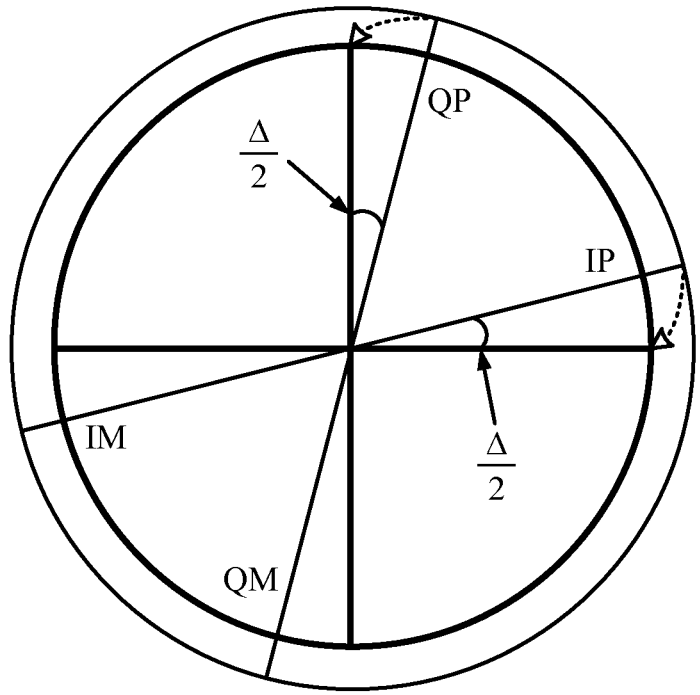
FIG. 8 illustrates an example of duplex I/Q phase imbalance adjustment corresponding to the implementation in FIG. 6A, according to an embodiment of the present disclosure.

FIG. 8 illustrates an example of duplex I/Q phase imbalance adjustment corresponding to the implementation in FIG. 6A, according to an embodiment of the present disclosure. PCIO represents a phase-corrected I output, and PCQO represents a phase-corrected Q output, according to the equations shown in FIG. 8. This duplex phase imbalance adjustment may entail a minimal or no amplitude change. If $\Delta$ (a combination of the mixer and LO I and Q phase imbalance and the baseband input-referred phase imbalance) is a small enough value, the value of may be 1. There may be amplitude drops due to $\alpha = 2\tan(\Delta/2)$ as illustrated.

Figure 9:
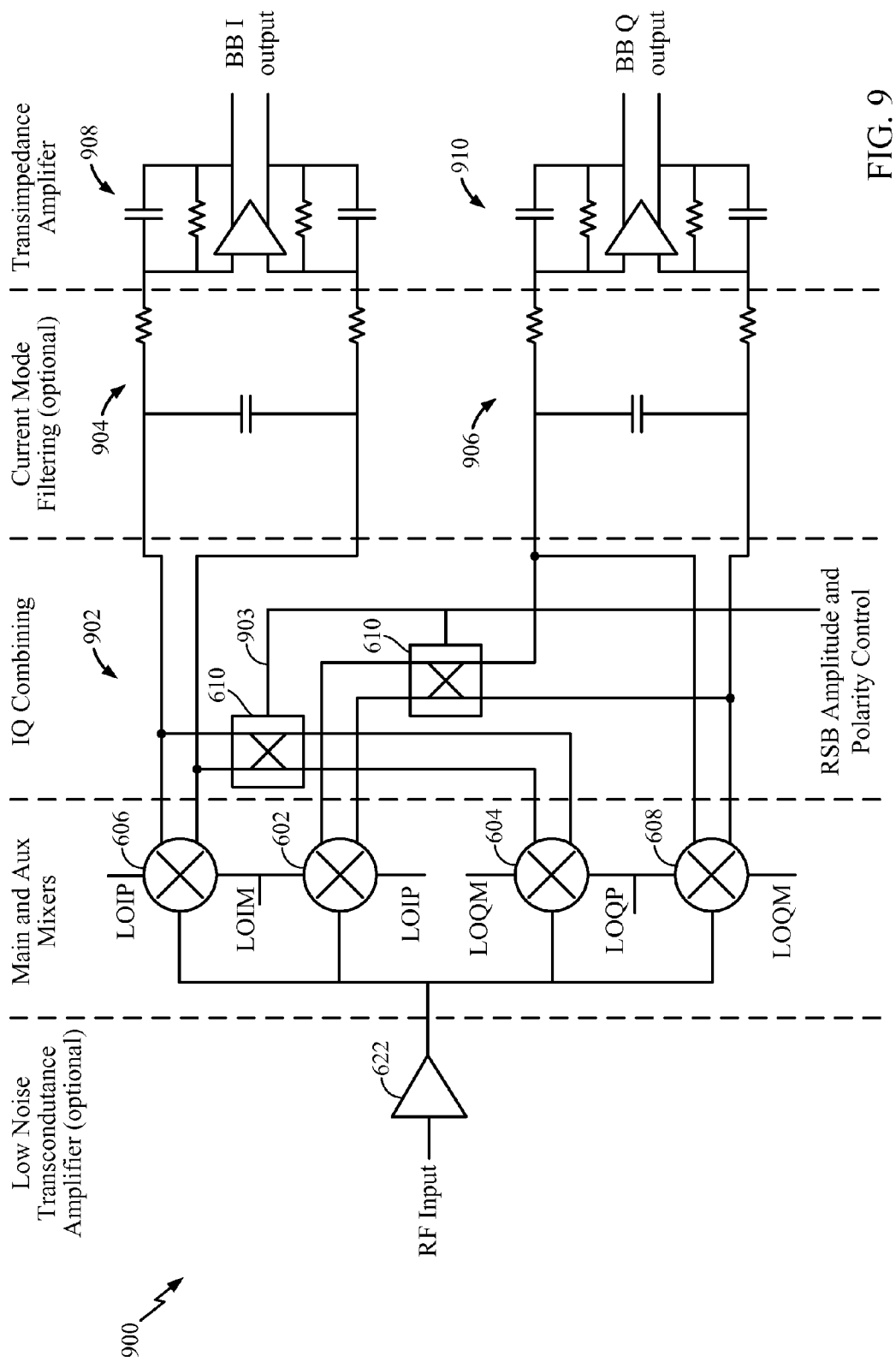
FIG. 9 is a schematic diagram of an exemplary RF front end (RFFE) with a phase imbalance adjusting circuit using auxiliary mixers according to an embodiment of the present disclosure.

FIG. 9 is a schematic diagram of an exemplary RF front end (RFFE) 900 with a phase imbalance adjusting circuit using auxiliary mixers 602, 604, according to an embodiment of the present disclosure. A low noise transconductance amplifier 622 may precede the main and auxiliary mixers and may be used to amplify an RF input. The main and auxiliary mixers may be single balanced mixers or double balanced mixers. The mixer output may be provided to an I-Q combining circuit 902, where the X boxes represent polarity and/or gain control circuits 610 as described above. One or more control lines 903 may be connected with the polarity and/or gain control circuits 610 to control the components therein (e.g., adjust the on-resistance of a transistor 612, modify the resistance of a variable resistor (e.g., a rheostat), or control operation of a switch). Optionally, current mode filters 904, 906 (e.g., baseband filters) may be used to filter the baseband signals output by the mixers 602, 604, 606, 608 and the I-Q combining circuit 902. The current mode filters 904, 906 may be implemented with any suitable combination of resistors, capacitors, and inductors for baseband (low-pass) filtering. The mixed (and optionally filtered) signals may be provided to transimpedance amplifiers 908, 910 to convert the current-mode baseband signals to voltage-mode baseband I and Q signals for additional baseband processing.

Phase Adjustment by Partial Combining of Quadrature Mixer Outputs

Figure 10:
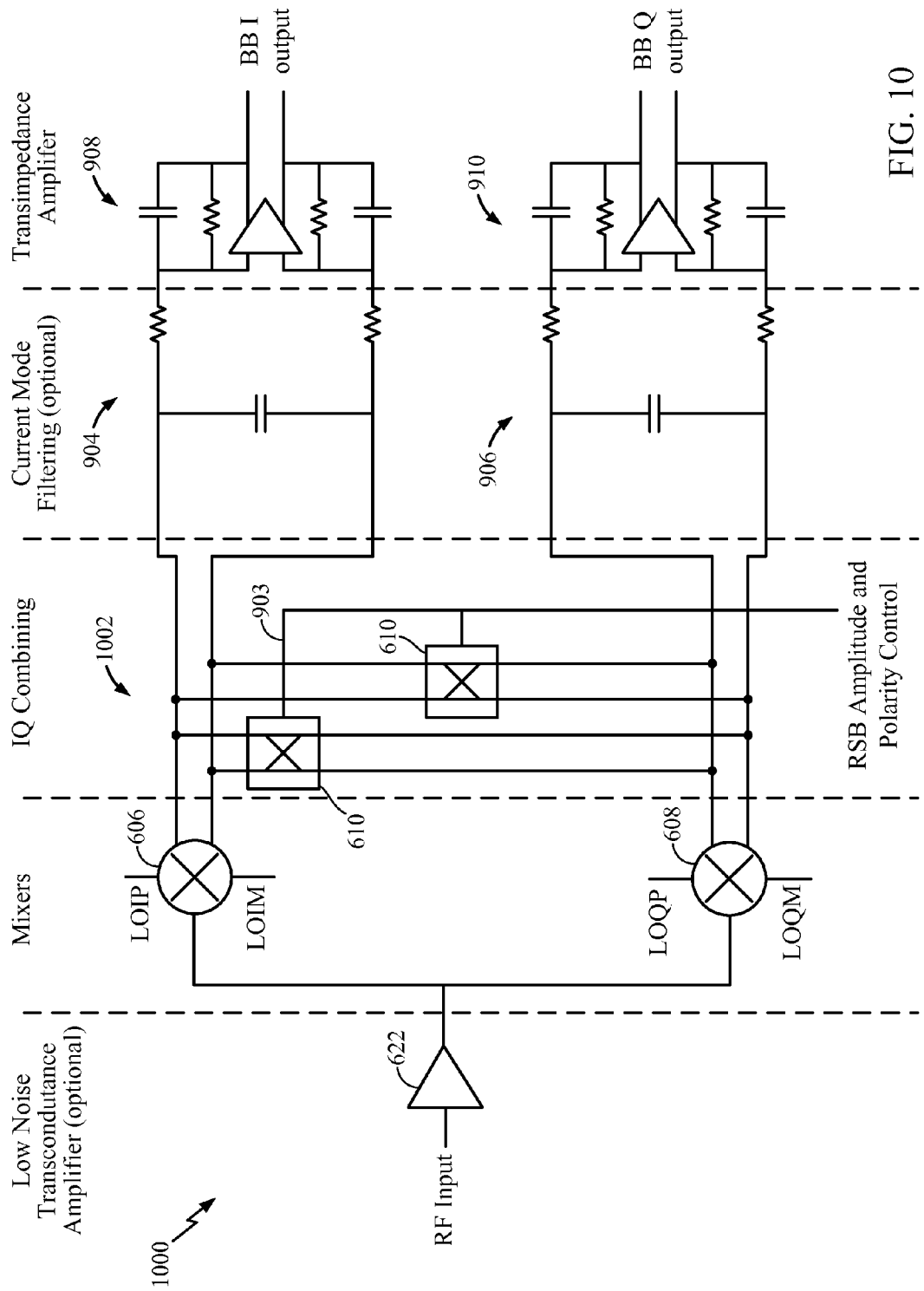
FIG. 10 is a schematic diagram of an exemplary RFFE 1000 with a phase imbalance adjusting circuit using partial combining of quadrature mixer output signals (e.g., without the auxiliary mixers described above) according to an embodiment of the present disclosure.

FIG. 10 is a schematic diagram of an exemplary RFFE 1000 with a phase imbalance adjusting circuit using partial combining of quadrature mixer output signals (e.g., without the auxiliary mixers 602, 604 described above), according to an embodiment of the present disclosure. The functions of the main and auxiliary mixers may be effectively combined in FIG. 10, such that the normal I and Q mixers 606, 608 receive an RF input, which may be amplified by an optional low noise transconductance amplifier 622. Although a single-ended output signal from the amplifier 622 is connected with single-balanced mixers as shown in FIG. 10, the output of the amplifier 622 may be a differential signal instead, in which case double-balanced mixers may be used. The mixer outputs may be provided to an I-Q combining circuit 1002 connected as shown, where the X boxes represent polarity and/or gain control circuits 610 as described above. For certain embodiments, one or the other of the polarity and/or gain control circuits 610 may be included (i.e., one of the X boxes is optional). The combined baseband outputs, which may be filtered using optional current mode filters 904, 906, may be provided to trans-impedance amplifiers 908, 910 to convert the current-mode signals to voltage-mode signals (e.g., baseband I and Q signals) for additional processing.

For certain embodiments, a polarity and/or gain control circuit 610 may be implemented with four transistors, each drain and source of the transistors connected between a different one of the four combinations of LOIP, LOIM, LOQP, and LOQM. There may be a resistor between each mixer signal line and the drain or source of the transistor, for a total of eight series resistors.

Figure 11:
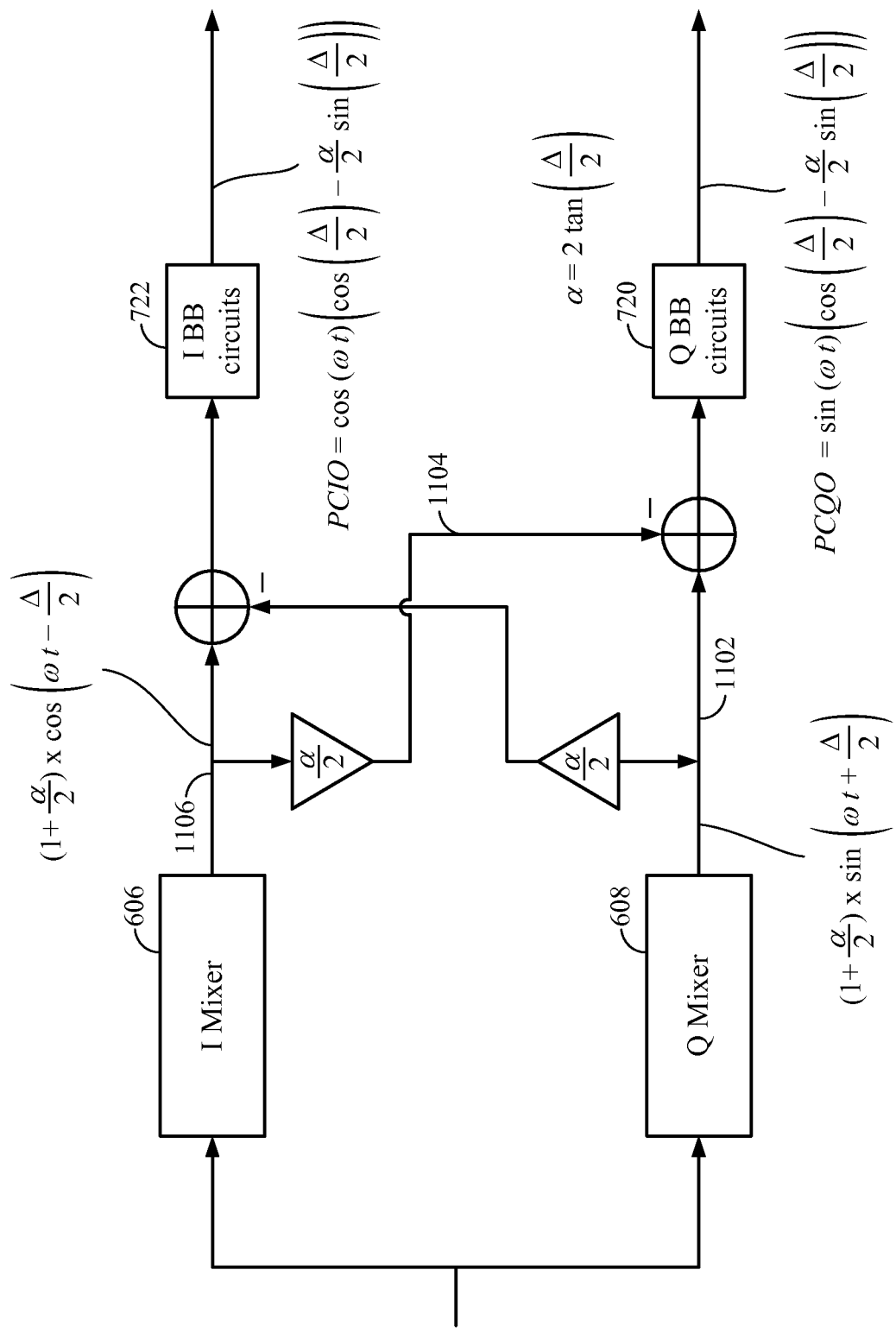
FIG. 11 is a block diagram of a system for phase imbalance adjusting without using auxiliary mixers and presenting associated signal equations, according to an embodiment of the present disclosure.

FIG. 11 is a block diagram conceptually illustrating the phase imbalance adjusting without using auxiliary mixers and presenting associated signal equations, according to an embodiment of the present disclosure. An RF signal may be provided as input to an I mixer 606 and to a Q mixer 608. A fraction of the amplitude ($\alpha/2$) of one mixer's output signal may be combined with the output signal from another mixer. For example, as illustrated, an output 1102 from the Q mixer 608 may be combined (e.g., summed) with the partial output 1104 from the I mixer 606, and an output 1106 from the I mixer 606 may be combined with the partial output 1108 from the Q mixer 608. These signal combinations lead to the PCIO and PCQO signals with associated equations as shown in FIG. 11.

Figure 12A:
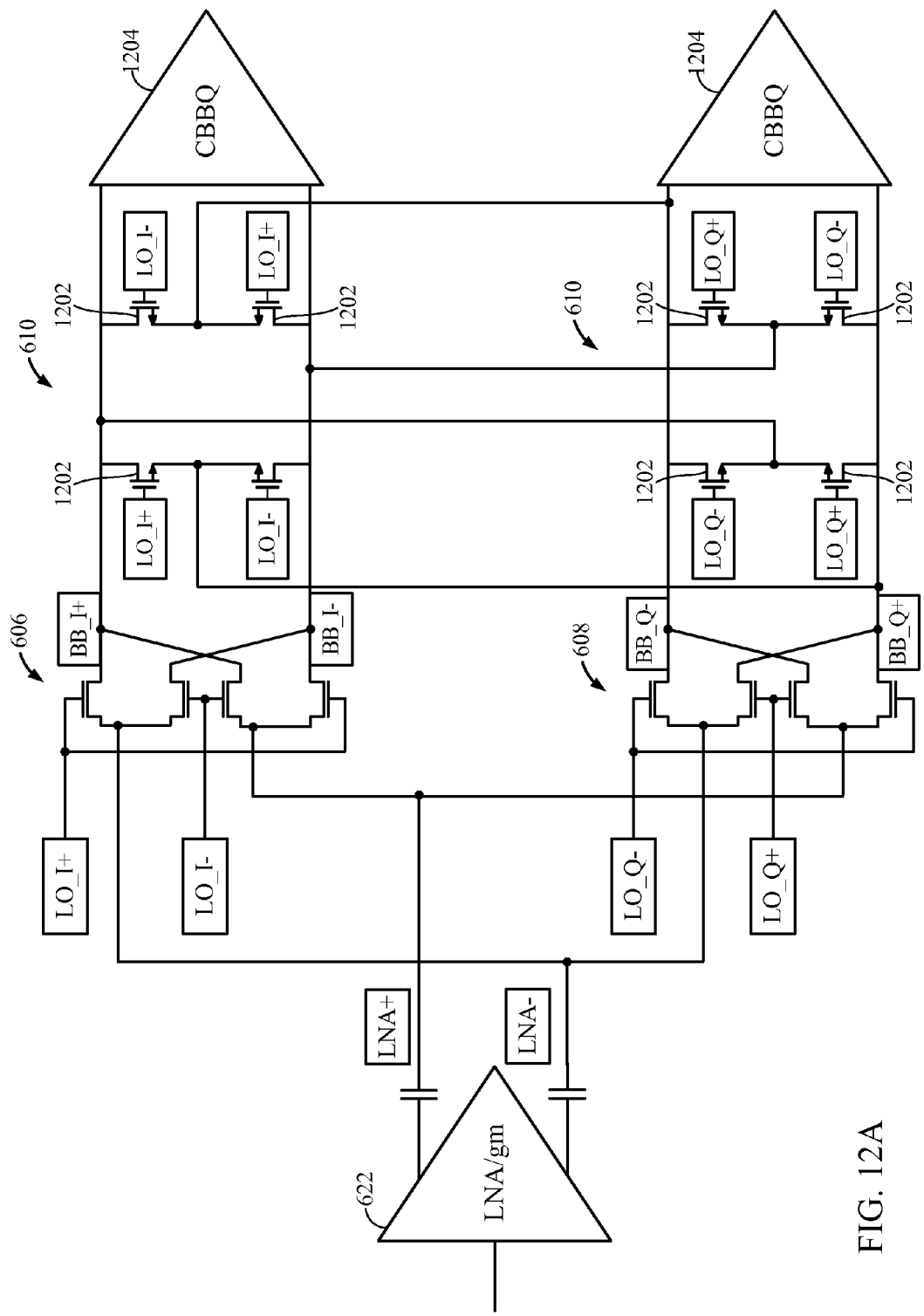
FIGS. 12A and 12B are schematic diagrams of exemplary implementations of a phase imbalance adjusting circuit using partial combining of quadrature mixer output signals, according to embodiments of the present disclosure.
Figure 12B:
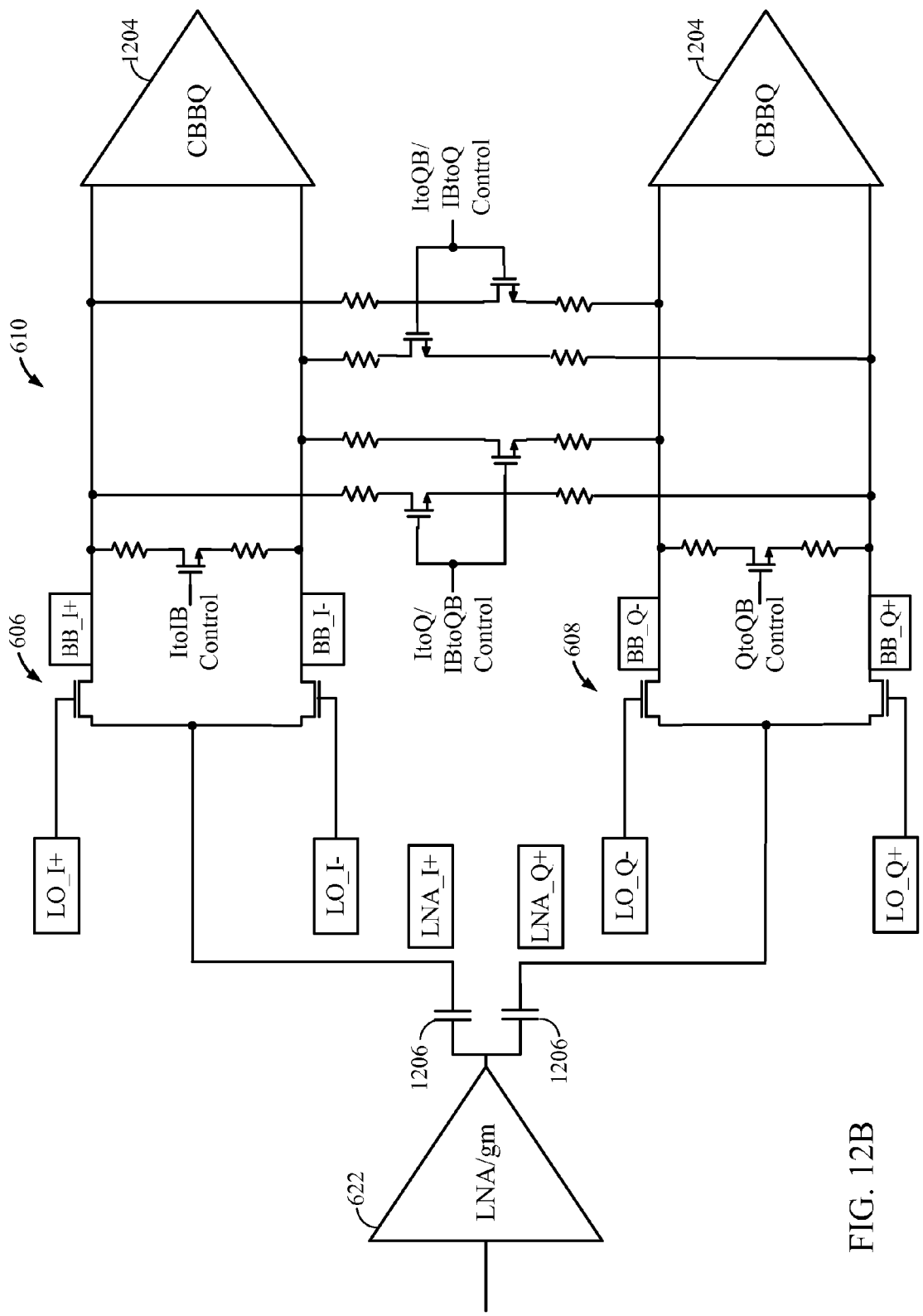

FIGS. 12A and 12B are schematic diagrams of exemplary implementations of a phase imbalance adjusting circuit using partial combining of quadrature mixer output signals, according to embodiments of the present disclosure. In FIG. 12A, double-balanced mixers are shown, and the local oscillator signals LO_I and LO_Q are connected with gates of the transistors 1202 in the polarity and/or gain control circuits 610, such that the timing of the partial combining is synchronized. For certain embodiments, LO_I+ and LO_I− may be interchanged in the polarity and/or gain control circuit 610 from what is shown in FIG. 12A. Likewise, LO_Q+ and LO_Q− may also be interchanged in the other polarity and/or gain control circuit 610.

For certain embodiments, interchanging the LO_I+ and LO_I− (and/or the LO_Q+ and LO_Q−) may be accomplished by placing multiplexers (i.e., muxes) between the gates of the transistors 1202 and the various differential quadrature LO signals. By employing muxes, the +/−LO connections may be swapped.

For certain embodiments, the amount of the coupling (i.e., the partial combining) is controlled by activating more or less transistors 1202. If the number of the activated transistors 1202 is greater, the amount of the coupling increases, and vice versa. The activation of each transistor 1202 may be achieved by turning on or off the buffers in the LO driving path. If the buffers are on, the transistors 1202 may be activated, whereas if the buffers are off, the transistors may be deactivated.

The circuit in FIG. 12A also includes current buffer biquads (CBBQs) 1204, which may be baseband filters that have low impedance inputs and provide a $2^{nd}$-order baseband transfer function. For certain embodiments, the CBBQs 1204 may be preceded by optional current mode filtering or may be replaced with transimpedance amplifiers with optional current mode filtering, as illustrated in FIGS. 9 and 10.

FIG. 12B is a schematic diagram of an exemplary implementation with single-balanced mixers. In this implementation, the output of the LNA 622 may be single-ended, and AC coupling capacitors 1206 are used to couple the single-ended output of the LNA 622 to the normal I and Q mixers 606, 608. For other embodiments, however, a single common capacitor may be used instead, since LNA_I+ and LNA_Q+ signals have the same amplitude and phase. At the mixer outputs, I may be coupled to Q (and IB may be coupled to QB) through the combining paths controlled by the ItoQ/IBtoQB control signal. Alternatively, I may be coupled to QB (and IB may be coupled to Q) through the combining paths controlled by the ItoQB/IbtoQ control signal. If the coupling paths are implemented as multiple sets of resistors and transistors in parallel, the strength of the coupling may be modified by controlling the number of transistors which are enabled by the control signals. Further, gain control on the I and Q mixer outputs may be provided by the ItoIB coupling path (which is controlled by the ItoIB control signal) and by the QtoQB coupling path (which is controlled by the QtoQB control signal). As with FIG. 12A, the CBBQs 1204 may be optionally preceded by optional current mode filtering or may be replaced by any combination of current mode filtering and transimpedance amplifiers (TIA), as illustrated in FIGS. 9 and 10.

Figure 13:
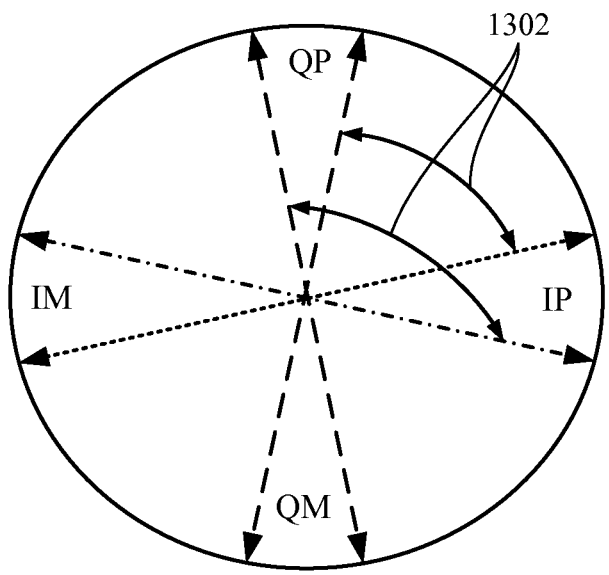
FIG. 13 illustrates an example of possible I-Q corrections that may be performed by a phase imbalance adjusting circuit using partial combining of quadrature mixer output signals, such as in the RFFE in FIG. 10 or implementations thereof.

FIG. 13 illustrates an example of possible I-Q corrections that may be performed by a phase imbalance adjusting circuit using partial combining of quadrature mixer output signals, such as in the RFFE 1000 in FIG. 10 or implementations thereof. As shown, the angle 1302 between IP/IM and QP/QM may be increased or decreased, where I and Q are adjusted together. I and Q may not be independently controlled in this implementation, in contrast with phase imbalance adjusting circuits using auxiliary mixers, such as the RFFE 900 in FIG. 9 or implementations thereof. The corrections in FIG. 13 may be summarized by the equations $$I'=I+\alpha Q$$

and $$Q'=Q+\alpha I$$

where $\alpha$ is between −10% and 10% inclusive, for example. However, if partial combining of quadrature mixer output signals is implemented with time synchronization as described with respect to FIG. 12A, then independent control of coupling from Q to I and from I to Q may be possible to implement, as is the case with phase imbalance adjusting using auxiliary mixers.

Example Mixer Implementations

Figure 14:
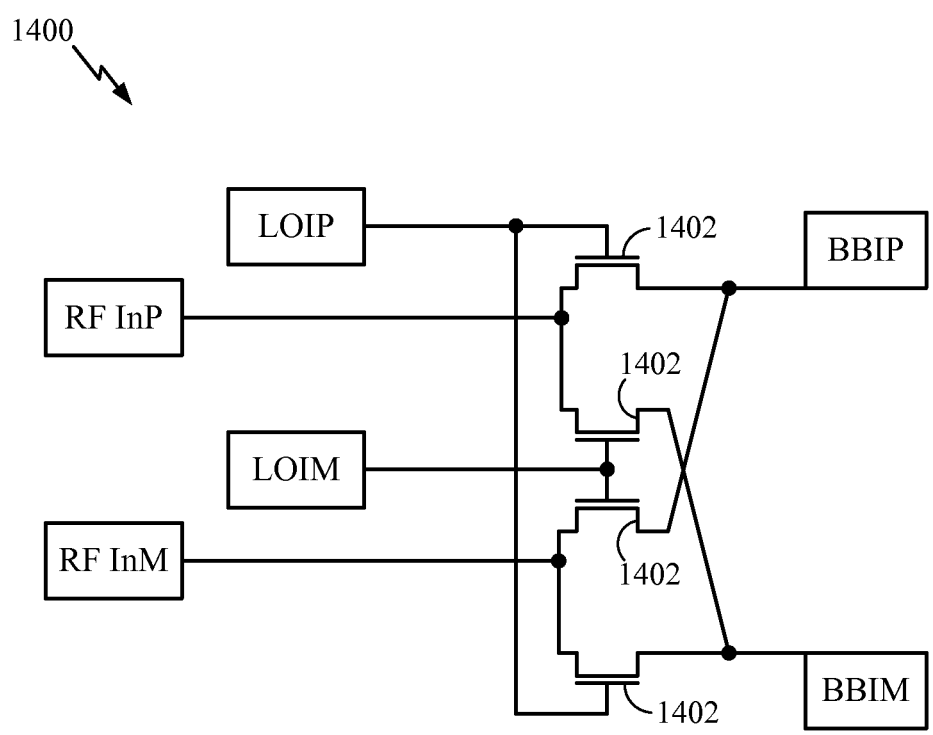
FIG. 14 illustrates an exemplary double balanced mixer that may be used as a mixer in a phase imbalance adjusting circuit, as main or auxiliary mixers, according to embodiments of the present disclosure.

FIG. 14 illustrates an exemplary double balanced mixer 1400 that may be used as a mixer in a phase imbalance adjusting circuit, as main or auxiliary mixers, according to embodiments of the present disclosure. The transistors 1402 of the mixer 1400 may mix a differential RF signal (RF InP and RF InM) with a differential LO signal (such as a differential I LO signal composed of LOIP and LOIM). The mixing produces a differential (baseband) output signal (BBIP and BBIM) having frequency components at the sum and difference frequencies of the differential RF and LO signals.

The channel width-to-length ratio (W/L) of an auxiliary mixer transistor may be smaller than the W/L of a main mixer transistor. For example, the W/L of an auxiliary mixer transistor can be between 10 and 100 times smaller than that of a main mixer transistor (e.g., W/L of 0.3 to 3 for an auxiliary mixer transistor versus 30 for a main mixer transistor). The auxiliary mixer may be designed to any suitable size (i.e., channel width-to-length ratio (W/L)) to provide a desired phase imbalance correction and is not limited to the previous example.

Figure 15A:
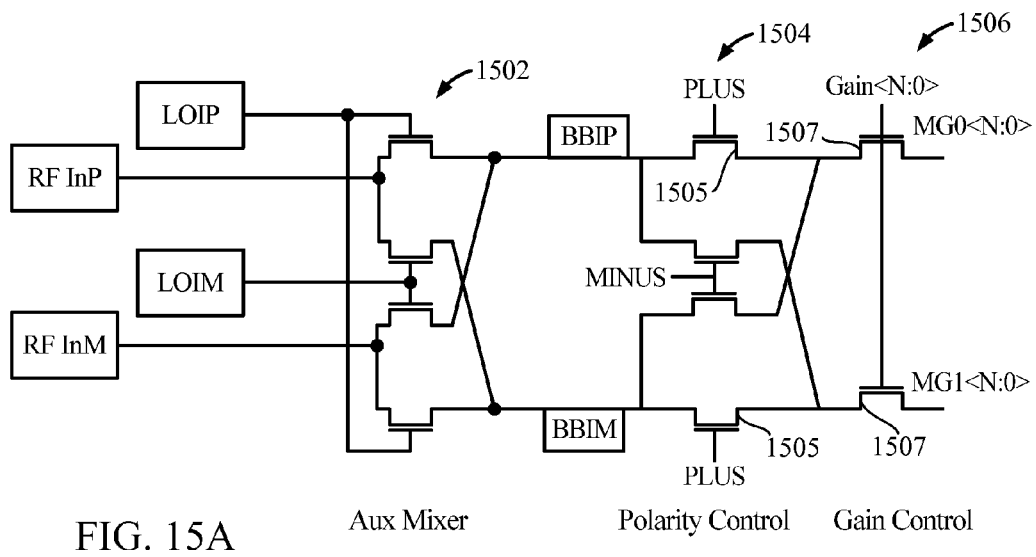
FIGS. 15A-15F illustrate an exemplary mixer implementation with various example polarity and/or gain control circuits according to embodiments of the present disclosure.

FIGS. 15A-15F illustrate an exemplary mixer implementation with various example polarity and/or gain control circuits 610, according to embodiments of the present disclosure. In FIG. 15A, an auxiliary mixer 1502 provides input to a polarity control circuit 1504 (composed of four transistors 1505) and a digital gain control circuit 1506. The effective auxiliary mixer gain (i.e., the overall gain through the auxiliary mixer and the polarity and/or gain control circuit) may be controlled, for example, by (digitally) controlling the number N of transistors 1507 in parallel that are enabled. The order of the polarity and gain control circuits 1504, 1506 is interchangeable.

Figure 15B:
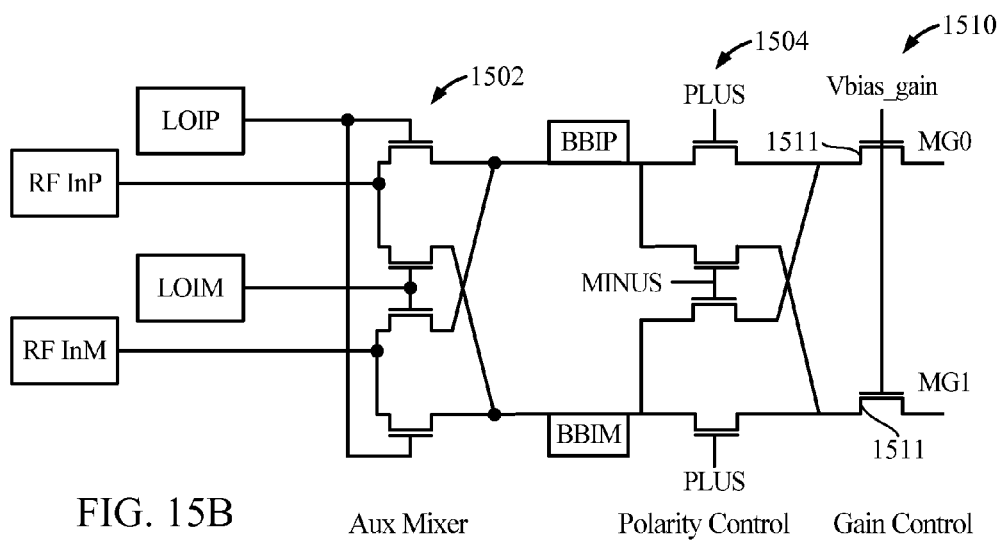

FIG. 15B illustrates an auxiliary mixer 1502 providing input to a polarity control circuit 1504 and an analog gain control circuit 1510, in contrast with the digital gain control circuit 1506 of FIG. 15A. The effective auxiliary mixer gain may be controlled, for example, by controlling the gate bias on gain control transistors 1511, which may control the $R_{ds(on)}$ of the gain control transistors. The order of the polarity and gain control circuits 1504, 1510 is interchangeable. For certain embodiments, the digital gain control circuit 1506 may be cascaded with the analog gain control circuit 1510, in either order.

Figure 15C:
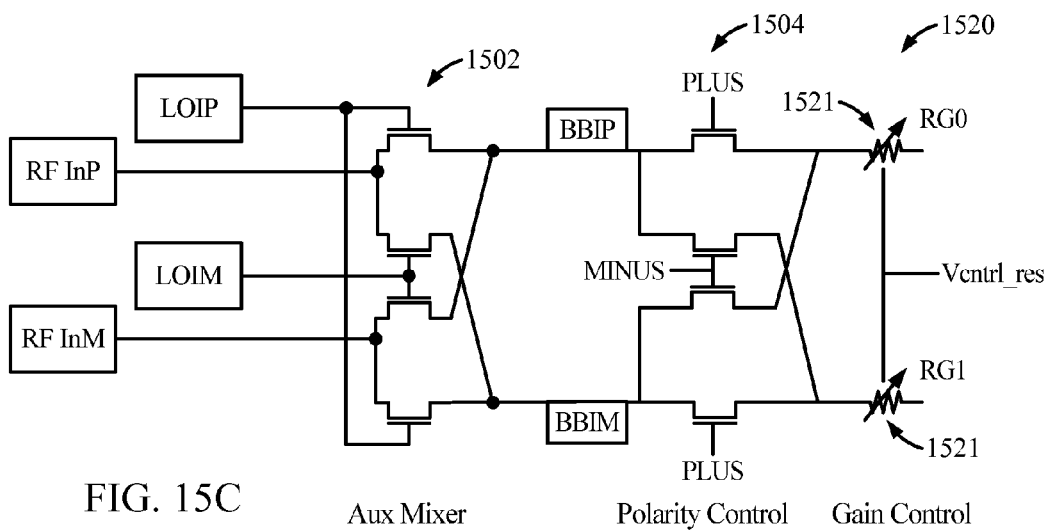

FIG. 15C illustrates an exemplary circuit similar to FIG. 15B, with variable resistors 1521 used in place of the gain control transistors 1511 in the gain control circuit 1520. The variable resistance may be analog or digitally controlled via a control line Vcntrl_res, for example.

Figures 15D, 15E:
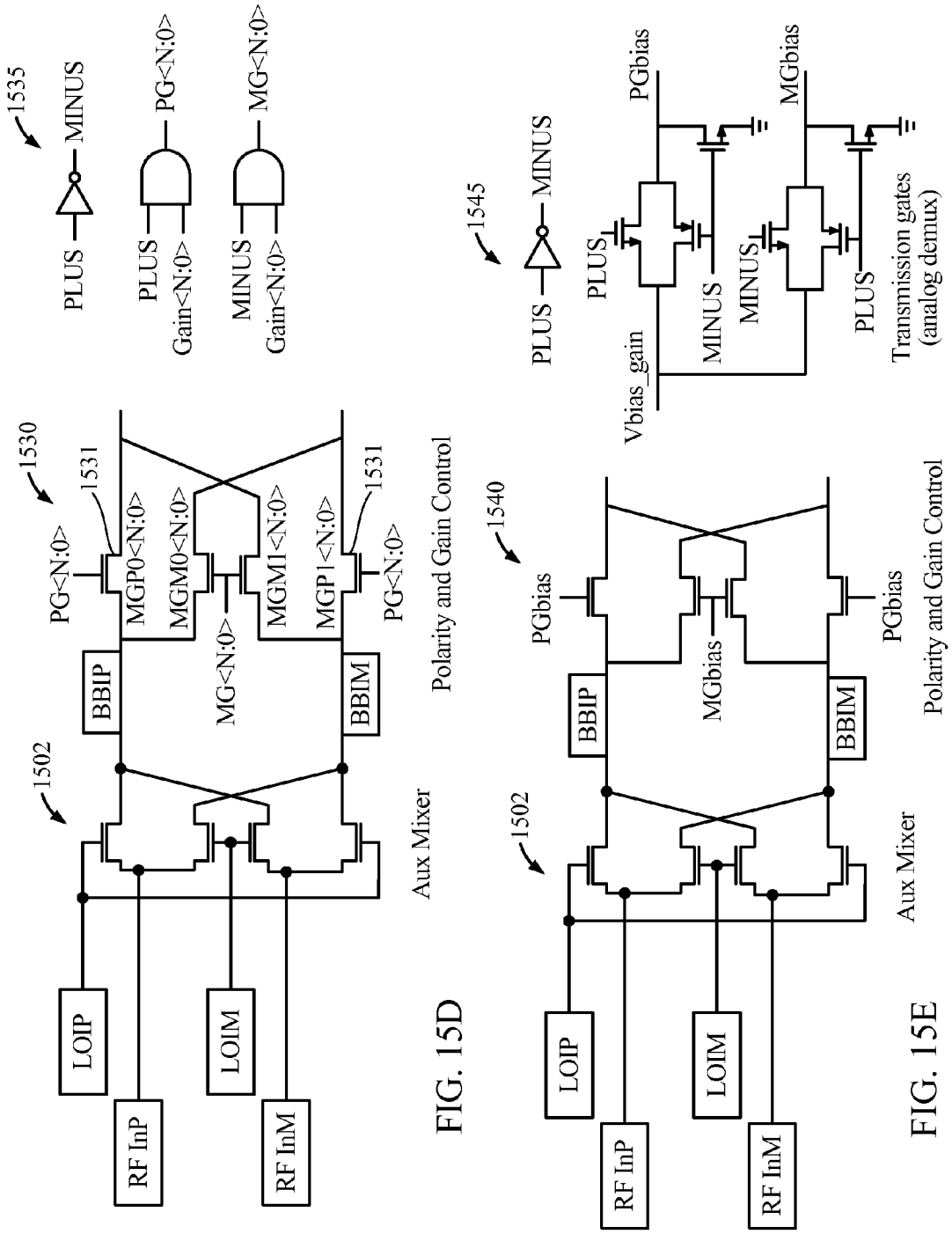

For certain embodiments, polarity and gain controls may be merged. For example, FIG. 15D illustrates an exemplary circuit 1530 similar to FIG. 15A, with polarity and gain control merged into four groups of selectively enabled parallel transistors 1531 connected with the auxiliary mixer 1502. Digital control lines may be used to select various combinations of the N transistors in each group. Digital logic (e.g., logic gates 1535) may also be used to effectively control the polarity and/or gain of the circuit 1530.

FIG. 15E illustrates an exemplary circuit 1540 similar to that shown in FIG. 15B, but with polarity and gain control merged into four transistors 1541. For certain embodiments, transmission gates 1545 (e.g., an inverter and an analog demultiplexer) may be used to create the bias signals for controlling the polarity and/or the gain.

Figure 15F:
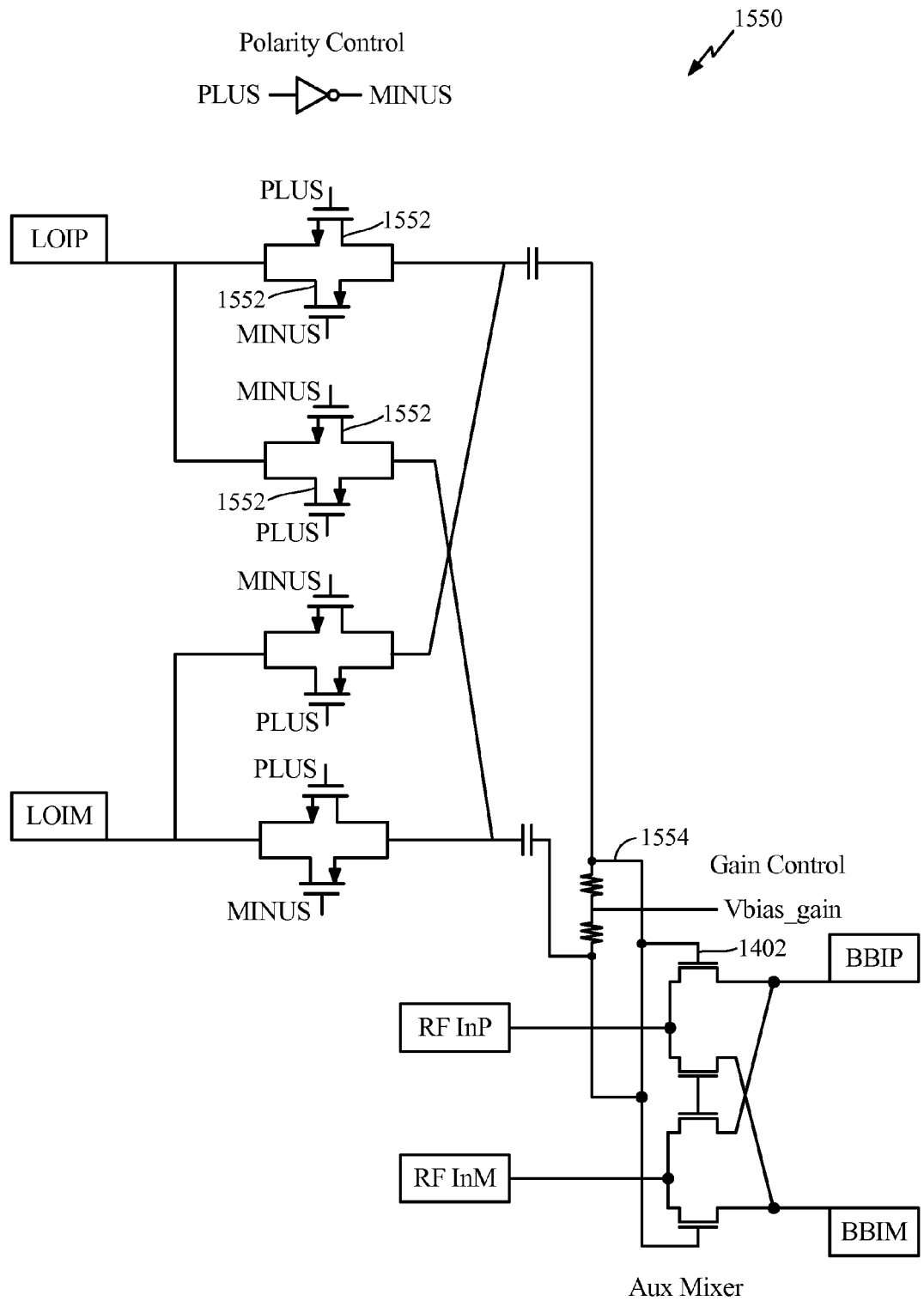

FIG. 15F illustrates an exemplary circuit 1550 that may be used to implement the variable auxiliary mixers 602b, 604b of FIG. 6B. The polarity here is controlled by selectively swapping the LO signal polarity (using switches or transistors 1552 controlled by the PLUS and MINUS signals), and the gain is controlled by controlling the DC bias 1554 on the gates of the auxiliary mixer transistors 1402 using the control line Vbias_gain.

Figure 16:
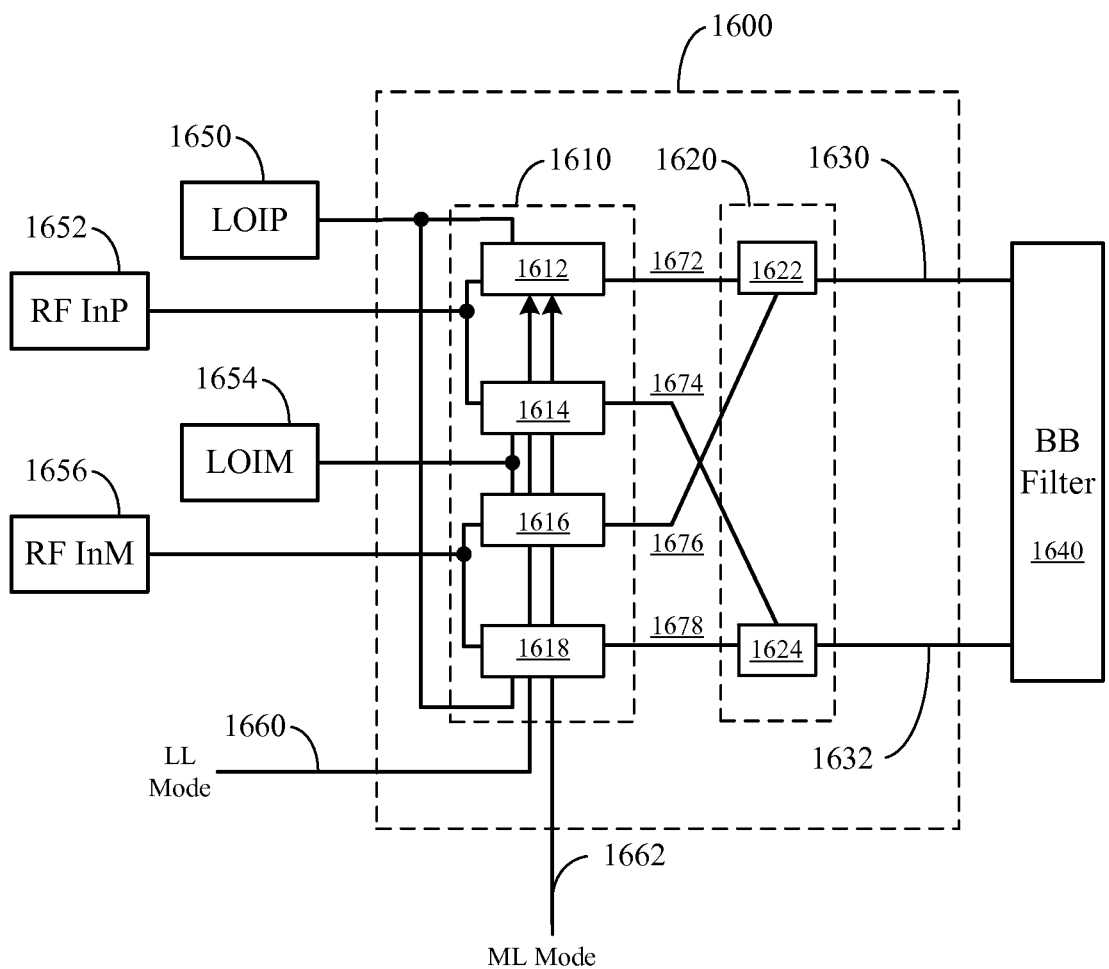
FIG. 16 illustrates an exemplary double balanced mixer (similar to the mixer shown in FIG. 14) that may be used as a mixer in a phase imbalance adjusting circuit in auxiliary mixers according to an embodiment of the present disclosure.

FIG. 16 illustrates an exemplary double balanced mixer 1600 (similar to the mixer 1400 shown in FIG. 14) that may be used as an auxiliary mixer in a phase imbalance adjusting circuit according to another embodiment of the present disclosure. The mixer 1600 of FIG. 16 includes a plurality of mixing circuits 1610 and a plurality of combining circuits 1620. In the illustrated embodiment of FIG. 16, the plurality of mixing circuits 1610 includes four mixing circuits 1612, 1614, 1616, 1618, each of which may be configured as an auxiliary mixing circuit 1700 shown in FIG. 17A or as a mixing circuit 1402 shown in FIG. 14. However, at least one of the plurality of mixing circuits 1610 will be configured as an auxiliary mixing circuit 1700 shown in FIG. 17A. In one embodiment, a combining circuit 1622 or 1624 includes a summing circuit which adds or subtracts two input signals to produce an output signal.

In one embodiment, the auxiliary mixer 1600 receives a differential LO signal and a differential RF input signal. The differential LO signal comprises a positive in-phase LO signal (LOIP) 1650 and a negative in-phase LO signal (LOIM) 1654. The differential RF input signal comprises a positive RF input signal (RF InP) 1652 and a negative RF input signal (RF InM) 1656. In other embodiments, the differential LO signal comprises a positive quadrature LO signal (LOQP) and a negative quadrature LO signal (LOQM). The auxiliary mixer 1600 also receives a plurality of linearity mode control signals including a low linearity mode (LL mode) control signal 1660 and mid-linearity mode (ML mode) control signal 1662. Further, the auxiliary mixing circuit 1600 generates a differential (baseband) output signal comprising a positive baseband output signal (BBIP) 1630 and a negative baseband output signal (BBIM) 1632. The positive baseband output signal (BBIP) 1630 has its frequency component at the sum frequency of the differential RF and LO signals, while the negative baseband output signal (BBIM) 1632 has its frequency component at the difference frequency of the differential RF and LO signals.

In the illustrated embodiment of FIG. 16, the mixing circuit 1612 receives a positive in-phase LO signal (LOIP) 1650 and a positive RF input signal (RF InP) 1652, along with linearity mode control signals 1660, 1662. The mixing circuit 1612 mixes the two input signals 1650, 1652 to generate a first frequency converted signal 1672, which is output to the combining circuit 1622. The mixing circuit 1614 receives a negative in-phase LO signal (LOIM) 1654 and a positive RF input signal (RF InP) 1652, along with linearity mode control signals 1660, 1662. The mixing circuit 1614 mixes the two input signals 1652, 1654 to generate a second frequency converted signal 1674, which is output to the combining circuit 1624. The mixing circuit 1616 receives a negative in-phase LO signal (LOIM) 1654 and a negative RF input signal (RF InM) 1656, along with linearity mode control signals 1660, 1662. The mixing circuit 1616 mixes the two input signals 1654, 1656 to generate a third frequency converted signal 1676, which is output to the combining circuit 1622. The mixing circuit 1618 receives a positive in-phase LO signal (LOIP) 1650 and a negative RF input signal (RF InM) 1656, along with linearity mode control signals 1660, 1662. The mixing circuit 1618 mixes the two input signals 1650, 1656 to generate a fourth frequency converted signal 1678, which is output to the combining circuit 1624.

In the illustrated embodiment of FIG. 16, the combining circuit 1622 receives first and third frequency converted signals 1672, 1676 of the mixing circuits 1612, 1616, respectively, and combines the signals 1672, 1676 to generate the positive baseband output signal (BBIP) 1630. The combining circuit 1624 receives second and fourth frequency converted signals 1674, 1678 of the mixing circuits 1614, 1618, respectively, and combines the signals 1674, 1678 to generate the negative baseband output signal (BBIM) 1632. Two output signals 1630, 1632 of the combining circuits 1622, 1624 form the differential baseband output signal which is sent to the baseband filter 1640.

Figure 17A:
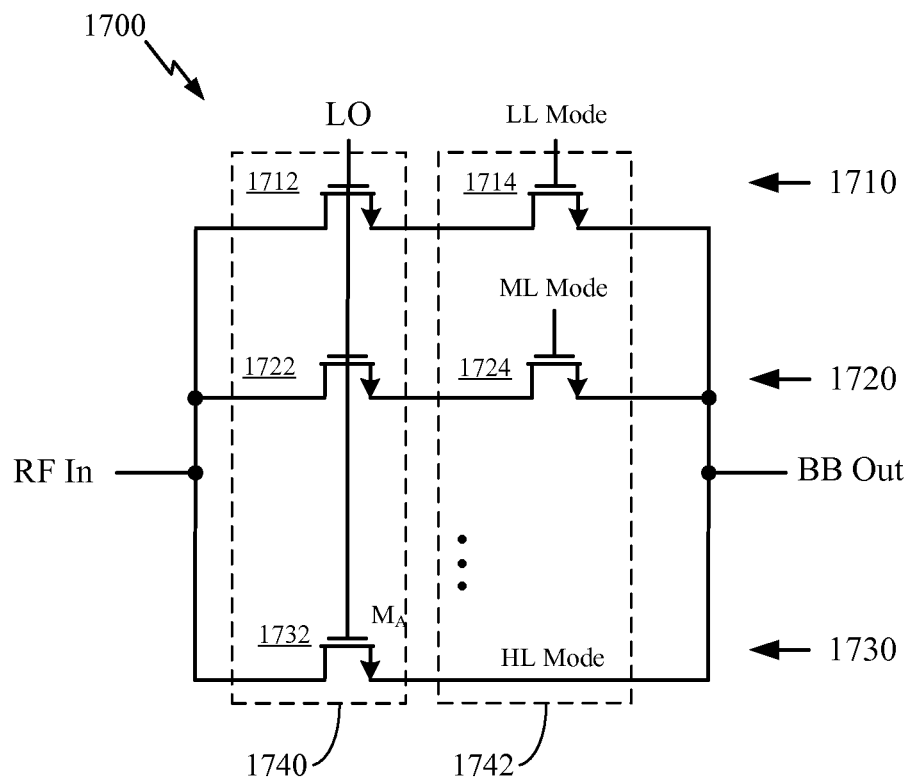
FIG. 17A is a schematic diagram of an exemplary implementation of an auxiliary mixer device according to one embodiment of the present disclosure.

FIG. 17A is a schematic diagram of an exemplary implementation of an auxiliary mixing circuit 1700 according to one embodiment of the present disclosure. As stated above, the auxiliary mixing circuit 1700 shown in FIG. 17A is one embodiment of at least one of the mixing circuits 1612, 1614, 1616, 1618. However, in other embodiments, any one of the mixing circuits 1612, 1614, 1616, 1618 can be configured as a mixing circuit 1402 shown in FIG. 14, instead of the auxiliary mixing circuit 1700.

In the illustrated embodiment of FIG. 17A, the auxiliary mixing circuit 1700 comprises a combination of devices such that the size of the auxiliary mixing circuit 1700 is adjustable as a function of the impedance of the baseband filter. The reason for configuring the size of the auxiliary mixing circuit 1700 to be adjustable as a function of the impedance of the baseband filter is that I and Q coupling currents change when the impedance of the baseband filter is changed (e.g., in the presence of jammers). Further, in half-duplex systems, several techniques can be employed to eliminate the receiver surface acoustic wave (SAW) filter ("SAW-less") due to the absence of concurrent operation of the transmitter. However, the removal of the input SAW filter causes jammers with high input levels to be present at the low noise amplifier (LNA) input. Further, the removal of the input SAW filter increases the dynamic range requirement up to 110 dB. Thus, in one embodiment, to implement a phase imbalance adjusting circuit in an auxiliary mixer of a Global System for Mobile Communications (GSM) SAW-less transceiver in the presence of jammers, the size of the auxiliary mixing circuit 1700 needs to be adjustable as a function of the impedance of the baseband filter. Since I and Q coupling currents are appropriately mixed in the mixer (as described above in detail) to adjust the phase imbalance, any disturbances of the ratio of the I and Q coupling currents cause increase in the noise figure.

To counter the disturbances to the ratio of the I and Q coupling currents, the auxiliary mixing circuit 1700, in one embodiment, is configured with a plurality of paths 1710, 1720, 1730, wherein each path represents one linearity mode. Thus, in one embodiment, the disturbances are countered by adjusting the resistance for the path of each linearity mode as a function of the impedance of the baseband filter. For example, for a low linearity mode path 1710, the value of metal oxide semiconductor field effect transistor (MOSFET) resistor (MOS resistor) 1712 is adjusted as a function of the baseband filter impedance, while MOSFET switch 1714 is turned on and MOSFET switch 1724 is turned off. The value of the MOSFET resistor is adjusted by adjusting the current flowing through the MOSFET. For a mid-linearity mode path 1720, the value of MOS resistor 1722 is adjusted as a function of the baseband filter impedance, while MOSFET switch 1724 is turned on and MOSFET switch 1714 is turned off. For a high linearity mode path 1730, the value of MOS resistor 1732 is adjusted as a function of the baseband filter impedance. It should be noted that although only three paths are shown in FIG. 17A, any number of linearity mode paths can be configured as a function of the baseband filter impedance. Further, it should also be noted that the linearity mode paths can be combined to provide different resistances for different baseband filter impedances. In FIG. 17A, LO-controlled MOS resistors 1712, 1722, 1732 are grouped and labeled as 1740, while linearity mode switches 1714, 1724 are grouped and labeled as 1742.

In one embodiment, the size of the auxiliary mixing circuit 1610 is adjusted using the different switched branches 1710, 1720, 1730 in accordance with a following equation:

$$W_{MA} = W_M \left( \frac{1 + \frac{R_{BB}}{R_{AUX}}}{1 + \frac{R_{BB}}{R_{MIX}}} \right)$$

wherein
$W_{MA}$=width-to-length ratio (W/L) of MOS resistor $M_A$,
$W_M$=width-to-length ratio (W/L) of MOS resistor M,
$R_{BB}$=impedance of the baseband filter,
$R_{AUX}$=resistance of switched linearity path of the auxiliary mixer device,
$R_{MIX}$=resistance of the normal mixer.

In another embodiment, the size of the auxiliary mixing circuit 1700 is adjusted by placing additional switched series resistors. In yet another embodiment, the size of the auxiliary mixing circuit 1700 is adjusted using a MOS-based programmable resistor.

Figure 17B:
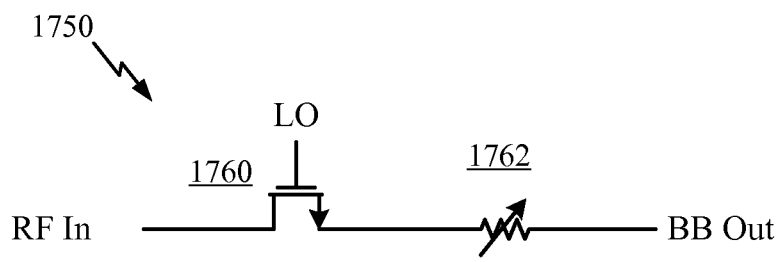
FIG. 17B is a schematic diagram of an exemplary implementation of an auxiliary mixer device according to another embodiment of the present disclosure.

FIG. 17B is a schematic diagram of an exemplary implementation of an auxiliary mixing circuit 1750 according to another embodiment of the present disclosure. In the illustrated embodiment of FIG. 17B, the auxiliary mixing circuit 1750 includes a single path such that the LO-controlled MOS resistors 1740 in FIG. 17A are replaced with a single LO-controlled MOS resistor 1760, while the linearity mode switches 1742 in FIG. 17A are replaced with at least one variable resistor 1762, which adjusts the current for a desired linearity mode. Thus, in this embodiment, the MOS resistor 1760 is driven by a local oscillator and acts as a switching device. The at least one variable resistor 1762 controls the current. In one embodiment, the variable resistor 1762 is implemented as a voltage-controlled variable resistor. In another embodiment, the variable resistor 1762 is implemented as a bank of switchable resistors.

Transceiver chips, LNAs, and mixers described herein may be implemented on an IC, an analog IC, an RFIC, a mixed-signal IC, an ASIC, a printed circuit board (PCB), an electronic device, etc. The receiver chips and LNAs may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the transceiver chips, LNAs, and mixers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system Skilled persons can implement the described functionality in varying ways for each particular application, but such implementation decisions should not be interpreted as causing a departure from the scope of the present disclosure. In addition, the grouping of functions within a module, block, or step is for ease of description. Specific functions or steps can be moved from one module or block without departing from the present disclosure.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a plurality of mixing circuits configured to generate a plurality of frequency converted signals;
   at least one mixing circuit of the plurality of mixing circuits is configured with a plurality of paths, each path representing one linearity mode,
   the plurality of paths comprising:
   a first path of a high-linearity mode configured with a first metal oxide semiconductor resistor; and
   a second path of a low-linearity mode configured with a second metal oxide semiconductor resistor and a first mode switch,
   the first and second metal oxide semiconductor resistors are controlled by a local oscillating signal; and
   a plurality of combining circuits configured to combine the plurality of frequency converted signals to generate a differential baseband output signal.

2. The apparatus of claim 1, the at least one mixing circuit is an auxiliary mixer of a Global System for Mobile Communications (GSM) SAW-less transceiver.

3. The apparatus of claim 1, the first mode switch is a metal oxide semiconductor switch controlled by a low-linearity mode signal.

4. The apparatus of claim 1, the plurality of paths further comprising
   a third path of a mid-linearity mode configured with a third metal oxide semiconductor resistor and a second mode switch,
   the third metal oxide semiconductor resistor is also controlled by the local oscillating signal.

5. The apparatus of claim 4, the second mode switch is a metal oxide semiconductor switch controlled by a mid-linearity mode signal.

6. The apparatus of claim 1, the plurality of mixing circuits configured to receive a differential local oscillator signal and a differential RF input signal,
   the differential local oscillator signal comprising a positive differential local oscillator signal and a negative differential local oscillator signal, and
   the differential RF input signal comprising a positive differential RF input signal and a negative differential RF input signal.

7. The apparatus of claim 6, the plurality of mixing circuits comprising first, second, third, and fourth mixing circuits,
   the plurality of mixing circuits configured to mix the differential local oscillator signal and the differential RF input signal to generate the plurality of frequency converted signals comprising first, second, third, and fourth frequency converted signals.

8. The apparatus of claim 7, the first mixing circuit configured to mix the positive differential local oscillator signal and a positive differential RF input signal to generate the first frequency converted signal.

9. The apparatus of claim 7, the second mixing circuit configured to mix the negative differential local oscillator signal and a positive differential RF input signal to generate the second frequency converted signal.

10. The apparatus of claim 7, the third mixing circuit configured to mix the negative differential local oscillator signal and a negative differential RF input signal to generate the third frequency converted signal.

11. The apparatus of claim 7, the fourth mixing circuit configured to receive the positive differential local oscillator signal and a negative differential RF input signal to generate the fourth frequency converted signal.

12. The apparatus of claim 7, the plurality of combining circuits comprising first and second combining circuits, the plurality of combining circuit configured to generate positive and negative baseband output signals of the differential baseband output signal.

13. The apparatus of claim 12, the first combining circuit configured to combine the first frequency converted signal and the third frequency converted signal to generate the positive baseband output signal.

14. The apparatus of claim 12, the second combining circuit configured to combine the second frequency converted signal and the fourth frequency converted signal to generate a negative baseband output signal of the differential baseband output signal.

15. The apparatus of claim 1, the at least one mixing circuit comprising
   a local oscillator-controlled metal oxide semiconductor resistor in series with at least one voltage-controlled variable resistor.

16. The apparatus of claim 15, each of the at least one voltage-controlled variable resistor is configured as a bank of switchable resistors.

17. An apparatus comprising:
plural means for mixing configured to generate a plurality of frequency converted signals,
at least one means of the plural means for mixing includes means for adjusting resistance as a function of a linearity mode,
wherein the means for adjusting resistance comprises means for switching and means for varying resistance as the function of the linearity mode; and
means for combining the plurality of frequency converted signals to generate a plurality of a differential baseband output signal.

18. The apparatus of claim 17, the means for adjusting resistance comprising
a plurality of paths, each path representing one linearity mode.

* * * * *